United States Patent
Kazama et al.

(10) Patent No.: US 8,073,641 B2
(45) Date of Patent: Dec. 6, 2011

(54) ELECTROMAGNETIC FIELD DISTRIBUTION MEASURING METHOD, APPARATUS FOR THE METHOD, COMPUTER PROGRAM AND INFORMATION RECORDING MEDIUM

(75) Inventors: Satoshi Kazama, Tokyo (JP); Keigo Hori, Tokyo (JP); Hiroshi Tsutagaya, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 643 days.

(21) Appl. No.: 11/813,598

(22) PCT Filed: Jan. 11, 2006

(86) PCT No.: PCT/JP2006/300167
§ 371 (c)(1),
(2), (4) Date: Jul. 10, 2007

(87) PCT Pub. No.: WO2006/075584
PCT Pub. Date: Jul. 20, 2006

(65) Prior Publication Data
US 2009/0006011 A1    Jan. 1, 2009

(30) Foreign Application Priority Data

Jan. 11, 2005 (JP) .................. 2005-003606

(51) Int. Cl.
*G01R 33/381* (2006.01)
*G06F 17/40* (2006.01)
(52) U.S. Cl. .................. 702/57; 702/65; 324/76.13
(58) Field of Classification Search .................. 702/57, 702/60, 65, 76
See application file for complete search history.

(56) References Cited

U.S. PATENT DOCUMENTS

| | | | |
|---|---|---|---|
| 5,231,346 A | 7/1993 | Gassman | |
| 5,689,183 A | 11/1997 | Kohama | |
| 6,300,779 B1 * | 10/2001 | Tamaki et al. | 324/750 |
| 6,456,070 B1 * | 9/2002 | Kazama et al. | 324/260 |
| 6,697,744 B2 * | 2/2004 | Uesaka et al. | 702/57 |
| 6,804,617 B2 * | 10/2004 | Kitayoshi | 702/75 |

(Continued)

FOREIGN PATENT DOCUMENTS

JP    09-218230    8/1997

(Continued)

OTHER PUBLICATIONS

Translation of JP 2002-071737, Mar. 12, 2002.*

(Continued)

*Primary Examiner* — Hal Wachsman
(74) *Attorney, Agent, or Firm* — Lowe Hauptman Ham & Berner, LLP

(57) ABSTRACT

Electromagnetic field distribution is measured by considering time variations of a measured electric and/or magnetic field value. In response to scanning performed with a probe at an arbitrary set of measurement coordinates in a predetermined measurement plane in the vicinity of an object to be measured, a signal is detected at each of plural sets of coordinates in a measurement plane. Electric and magnetic fields are computed during a measurement time period at each set of measurement coordinates in the measurement plane based on measurement coordinates where the probe is positioned and the signal is detected with the probe. Amplitude probability distribution during the time period at each set of measurement coordinates in the vicinity of the object is computed based on a computed intensity, then mapped and displayed.

6 Claims, 21 Drawing Sheets

U.S. PATENT DOCUMENTS

| | | | |
|---|---|---|---|
| 2002/0007251 A1* | 1/2002 | Tanaka et al. | 702/65 |
| 2003/0231145 A1* | 12/2003 | Uesaka et al. | 345/35 |
| 2006/0279273 A1* | 12/2006 | Kazama | 324/117 R |

FOREIGN PATENT DOCUMENTS

| | | |
|---|---|---|
| JP | 11-174130 | 7/1999 |
| JP | 2002-071737 | 3/2002 |
| JP | 2004-020403 | 1/2004 |
| WO | WO02084311 | 10/2002 |

OTHER PUBLICATIONS

Translation of JP 11-174130, Jul. 2, 1999.*
Translation of JP 09-218230, Aug. 19, 1997.*

\* cited by examiner

Mapping display of amplitude probability of excess of intensity over -50 dBm

- □ $10^{-1} \sim 1$
- ▨ $10^{-2} \sim 10^{-1}$
- ▨ $10^{-3} \sim 10^{-2}$
- ▨ $10^{-4} \sim 10^{-3}$ Mapping display of distribution of output level (dBm) with amplitude probability exceeding $10^{-4}$

- ▨ -20dBm ~ -15dBm
- ▨ -25dBm ~ -20dBm
- ▨ -30dBm ~ -25dBm
- ▨ -35dBm ~ -30dBm
- ▨ -40dBm ~ -35dBm
- ▨ -45dBm ~ -40dBm
- ▨ -50dBm ~ -45dBm
- ▨ -55dBm ~ -50dBm

ELECTROMAGNETIC FIELD DISTRIBUTION MEASURING METHOD, APPARATUS FOR THE METHOD, COMPUTER PROGRAM AND INFORMATION RECORDING MEDIUM

RELATED APPLICATIONS

The present application is based on, and claims priority from, Japanese Application Number 2005-003606, filed Jan. 11, 2005 and is a 371 of International Application No. PCT/JP2006/300167, filed Jan. 11, 2006 the disclosures of which are hereby incorporated by reference herein in their entirety.

TECHNICAL FIELD

The present invention relates to an electromagnetic field distribution measuring method of measuring an electromagnetic field distribution formed by radiation of an electromagnetic field from an object to be measured, an apparatus for the method, a computer program and an information recording medium.

BACKGROUND ART

Methods of measuring the intensity of an electromagnetic field formed by electromagnetic waves radiated from an electronic device, which have been practiced as a means to cope with EMI (Electromagnetic Interference), include specified ones described below.

For example, an electronic device on which a measurement is performed, i.e., an object to be measured (a device to be tested), is placed in an open space, and a loop antenna or a dipole antenna is placed at a distance of 3 m to 10 m from the object to be measured to make a measurement. In a case where an antenna is placed at such a sufficiently large distance from an object to be measured, only magnetic field components of a remote radiation electromagnetic field can be measured with the antenna if the antenna is a loop antenna, and only electric field components can be measured with the antenna if the antenna is a dipole antenna. If one of the two components of the remote radiation electromagnetic field is measured, the other component can be computed. Methods of measuring in an electric wave darkroom instead of measuring in an open space have also been specified.

In some case, an electromagnetic wave radiation source is identified on an object to be measured. For example, a case is conceivable in which determination is made as to from which position on a circuit board electromagnetic waves are strongly radiated. In such a case, a measurement different from that described above, i.e., a measurement of the electromagnetic field strength in the vicinity of an object to be measured, is performed. Ordinarily, a small loop antenna is brought close to an object to be measured to measure the magnetic field components of an electromagnetic field. That is, the magnetic field components of an electromagnetic field generated by an object to be measured are detected by utilizing electromotive force induced by electromagnetic coupling. The magnetic field components detected in this way are processed by computation processing to obtain the magnitude and phase of the signal. Conventional measuring devices capable of such magnetic field component measurement are, for example, a vector network analyzer, a vector signal analyzer and a spectrum analyzer. A current-voltage distribution in an object to be measured is obtained by using such a measuring device and performing scanning with a sensor such as a loop antenna. Identification of a radiation source is performed in this way.

The above-described method of using an open space or the like requires a wide installation space and a large amount of equipment investment. In recent years, therefore, an evaluation method using a coaxial transmission path called a TEM cell has attracted attention as a method of evaluating the intensity of radiated electromagnetic waves. In this evaluation method, an object to be measured is placed between an inner conductor and an outer conductor of a coaxial transmission path, and an evaluation is made through an output from one end of the inner conductor. This method has the advantage of enabling evaluation with a piece of equipment of a comparatively small scale.

On the other hand, identifying an electromagnetic wave radiation source with high accuracy by using the above-mentioned loop antenna requires eliminating the influence of electric field components. A shielded loop antenna provided by forming a shield on a loop antenna is frequently used for this reason. The shielded loop antenna is unsusceptible to the influence of electric field components and is, therefore, capable of measuring only magnetic field components with comparatively high accuracy.

An electromagnetic field intensity measuring method and apparatus capable of easily and accurately measuring each of the electric and magnetic field components of an electromagnetic field formed in space with a small and simple piece of equipment is known. For example, Re-published Japanese Patent Publication No. 02-084311 discloses such a measuring method and apparatus. In the method of measuring the electric field intensity and the magnetic field intensity disclosed in Re-published Japanese Patent Publication No. 02-084311, a conductor is placed in an electromagnetic field and a plurality of output currents output from the conductor in different directions with respect to the electromagnetic field are simultaneously measured. The magnitudes of the output currents and the phase difference between the output currents are thereby measured. An electric field component current produced in the conductor by the electric field and contained in the output currents and a magnetic field component current produced in the conductor by the magnetic field and contained in the output currents are computed on the basis of the magnitudes of and the phase difference between the plurality of output currents measured. The electric field strength and the magnetic field strength of the electromagnetic field are computed on the basis of the computed magnitudes of the electric field component current and the magnetic field component current.

When a conductor is placed in a space in which an electromagnetic field is formed, a current combined from a current produced by the electric field (electric field component current) and a current produced by the magnetic field (magnetic field component current) is ordinarily output. An electric field component current in currents output from particular portions of the conductor is constant even when the conductor is changed in orientation relative to the electromagnetic field. On the other hand, a magnetic field component current in the currents output from the particular portions of the conductor changes in magnitude and direction (phase) when the conductor is changed in orientation relative to the electromagnetic field. It is, therefore, possible to measure the magnitudes of and the phase difference between the plurality of output currents output from the conductor in different directions by simultaneously measuring the output currents. The electric field component current and the magnetic field component current contained in the outputs currents are computed on the basis of the magnitudes of the output currents and the phase difference between the output currents, thus enabling the electromagnetic field intensity to be measured with accuracy at the conductor position.

Patent document 1: Re-published Japanese Patent Publication No. 02-084311

In measurement of a noise signal with a spectrum analyzer, however, a spectrum is displayed by measuring the energy at certain frequencies while scanning frequencies, and the measured values fluctuate and vary if the measured signal fluctuates with time. The measured values also fluctuate and vary in the case of measurement by scanning with a sensor. Thus, there is a possibility of failure to perform an accurate distribution measurement. Further, in such a case, factors for variation with time cannot be measured.

In a case where the measured signal levels are low and vary with time, the difficulty in distinction from noise floor (changing randomly due to thermal noise) is considerably increased, resulting in failure to make an accurate measurement. For example, a portable telephone has such a faint internal noise. Evaluation of the influence of this noise on the receiving sensitivity of the portable telephone requires a different measurement.

Further, in the case of measurement of the influence on the receiving sensitivity of a digital communication device, the influence on the receiving sensitivity of the digital communication system is not sufficiently reflected in the maximum and mean values. Therefore the spectrum measurement in the conventional noise measurement alone is not sufficient for the desired relationship with the receiving sensitivity. That is, factors for the magnitude of the measured signal alone do not sufficiently reflect the influence on the receiving sensitivity and, therefore, the relationship between mapping of the electromagnetic field distribution formed by the measured signal and the receiving sensitivity cannot always be made definite. A relationship cannot be not established in which the degree of interference with digital communication is necessarily high at larger peaks of the maximum value of the spectrum or is necessarily low at valleys in spectrum level. The challenge is to perform a frequency measurement considering this relationship.

The present invention has been achieved in consideration of the above-described problems, and an object of the present invention is to provide an electromagnetic field distribution measuring method and an apparatus thereof capable of measuring an electromagnetic field distribution while considering variation with time in measured values, a computer program and an information recording medium.

DISCLOSURE OF THE INVENTION

To achieve the above-described object, according to the present invention, an electromagnetic field distribution measuring method is proposed in which the intensity of an electric field and/or a magnetic field in a space in the vicinity of an object to be measured functioning as an electromagnetic wave radiation source is detected with a probe to measure an electromagnetic field distribution in the vicinity of the object to be measured, the method including: a detection step of performing scanning with the probe in an arbitrary measurement position in the space in the vicinity of the object to be measured, and detecting the intensity during a predetermined measurement time period at a plurality of measurement positions; and a distribution computation step of computing the distribution of the intensity on the object to be measured including information on variation with time in the measurement time period.

According to the electromagnetic field distribution measuring method of the present invention, in the case of measurement of a vicinal electromagnetic field in which the magnitude of a signal fluctuates, an intensity signal is detected during a predetermined time period at each of a plurality of sets of measurement coordinates in a predetermined measurement plane in a space in the vicinity of an object to be measured; the intensity of at least any one of the electric field and the magnetic field at each set of measurement coordinates is measured during the measurement time period on the basis of the results of measurement with a probe; and the distribution of the intensity at each set of measurement coordinates including information on variation with time in the measurement time period is computed on the basis of the computed intensity. In this way, the electromagnetic field distribution can be measured while considering the variation with time and reducing the influence of noise floor (thermal noise). Further, in the case of measurement of the influence on the receiving sensitivity of a digital communication device, the electromagnetic field distribution is measured by considering variation with time as well as factors for the magnitudes of the measured signal, so that the relationship between mapping of the electromagnetic field distribution and the receiving sensitivity is made definite.

According to the present invention, an electromagnetic field distribution measuring apparatus which measures an electromagnetic field distribution in the vicinity of an object to be measured functioning as an electromagnetic wave radiation source is proposed as an apparatus for carrying out the above-described electromagnetic field measuring method. This apparatus includes a probe which outputs a signal corresponding to the intensity in a space in the vicinity of the object to be measured, scanning means of performing scanning with the probe at an arbitrary set of measurement coordinates, detection means of detecting the signal during a predetermined measurement time period at each of sets of measurement coordinates at which the probe is positioned, and storing the results of measurement with the probe, intensity computation means of computing the intensity during the measurement time period based on the detection means, and distribution computation means of computing the distribution of the intensity on the object to be measured including information on variation with time in the measurement time period at each set of measurement coordinates based on the intensity computation means.

In the electromagnetic field distribution measuring apparatus of the present invention, scanning is performed with the probe in an arbitrary set of measurement coordinates in a measurement plane in the space in the vicinity of the object to be measured functioning as an electromagnetic wave radiation source; the intensity of the electric field and/or the magnetic field is measured during the predetermined measurement time period; and the results of measurement with the probe is stored with respect to each set of measurement coordinates at which the probe is positioned. Further, the intensity of at least any one of the electric field and the magnetic field is computed during the measurement time period on the basis of the set of measurement coordinates at which the probe is positioned and the results of measurement with the probe, and the distribution of the intensity including information on variation with time in the measurement time period at each set of measurement coordinates in the vicinity of the object to be measured is computed on the basis of the computed intensity.

Thus, in the case of measurement in a vicinal electromagnetic field in which the magnitude of a signal fluctuates, the signal is detected during the measurement time period at each of a plurality of sets of measurement coordinates in a predetermined measurement plane in a space in the vicinity of the object to be measured; the intensity of at least any one of the electric field and the magnetic field at each set of measurement coordinates is computed during the measurement time period; and the electromagnetic field distribution at each set of measurement coordinates in the measurement plane including variation with time during the measurement time period is computed on the basis of the computed intensity. Thus, the electromagnetic field distribution can be measured while considering variation with time and reducing the influence of noise floor (thermal noise). Further, even in the case of measurement of the influence on the receiving sensitivity of a digital communication device, the electromagnetic field distribution is measured by considering variation with time as well as factors for the magnitude of the measured signal and, therefore, the relationship between mapping of the electromagnetic field distribution and the receiving sensitivity can be made definite.

According to the present invention, a computer program for computing an electromagnetic field distribution in the vicinity of an object to be measured functioning as an electromagnetic wave radiation source from the intensity of an electric field and/or a magnetic field in a space in the vicinity of the object to be measured is also proposed. The computer program includes a detection step of detecting a signal corresponding to the intensity at an arbitrary set of measurement coordinates in the space in the vicinity of the object to be measured during a predetermined measurement time period, and storing the signal, an intensity computation step of computing the intensity at the set of measurement coordinates during the measurement time period based on the detection step, and a distribution computation step of computing the distribution of the intensity on the object to be measured corresponding to variation with time in the measurement time period based on the intensity computation step.

According to the present invention, an information recording medium on which the above-described computer program is recorded is also proposed.

Further, according to the present invention, an information recording medium on which evaluation data indicating an electromagnetic field distribution in a space in the vicinity of an object to be measured mounted in an electronic device is stored is also proposed. The intensity of an electric field and/or a magnetic field at an arbitrary set of measurement coordinates on the object to be measured is recorded as evaluation data indicating an amplitude probability distribution at each set of measurement coordinates.

According to the electromagnetic field distribution measuring method and the apparatus thereof of the present invention, the electromagnetic field distribution can be measured while considering variation with time and reducing the influence of noise floor (thermal noise). Even in the case of measurement of the influence on the receiving sensitivity of a digital communication device, the electromagnetic field distribution is measured by considering variation with time as well as factors for the magnitude of the measured signal and, therefore, the relationship between mapping of the electromagnetic field distribution and the receiving sensitivity can be made definite.

The computer program of the present invention and the information recording medium on which the computer program is stored enables an apparatus for carrying out the above-described electromagnetic field distribution measuring method to be easily implemented.

Also, the information recording medium on which electromagnetic field distribution data in accordance with the present invention is stored ensures that if the above-described electromagnetic field distribution measurement is performed on an electronic component in a single state such as an IC or a composite module component provided as an object to be measured, and if an information recording medium on which electromagnetic field distribution data obtained as measurement results are stored or recorded is provided to a user together with the electronic component treated as the object to be measured, the user can know from which portion of the electronic component noise is generated most strongly, and can design an electronic circuit or an electronic device using the electronic component by considering this condition.

BRIEFLY DESCRIBE OF THE DRAWINGS

DESCRIPTION OF SYMBOLS

Figure 1:
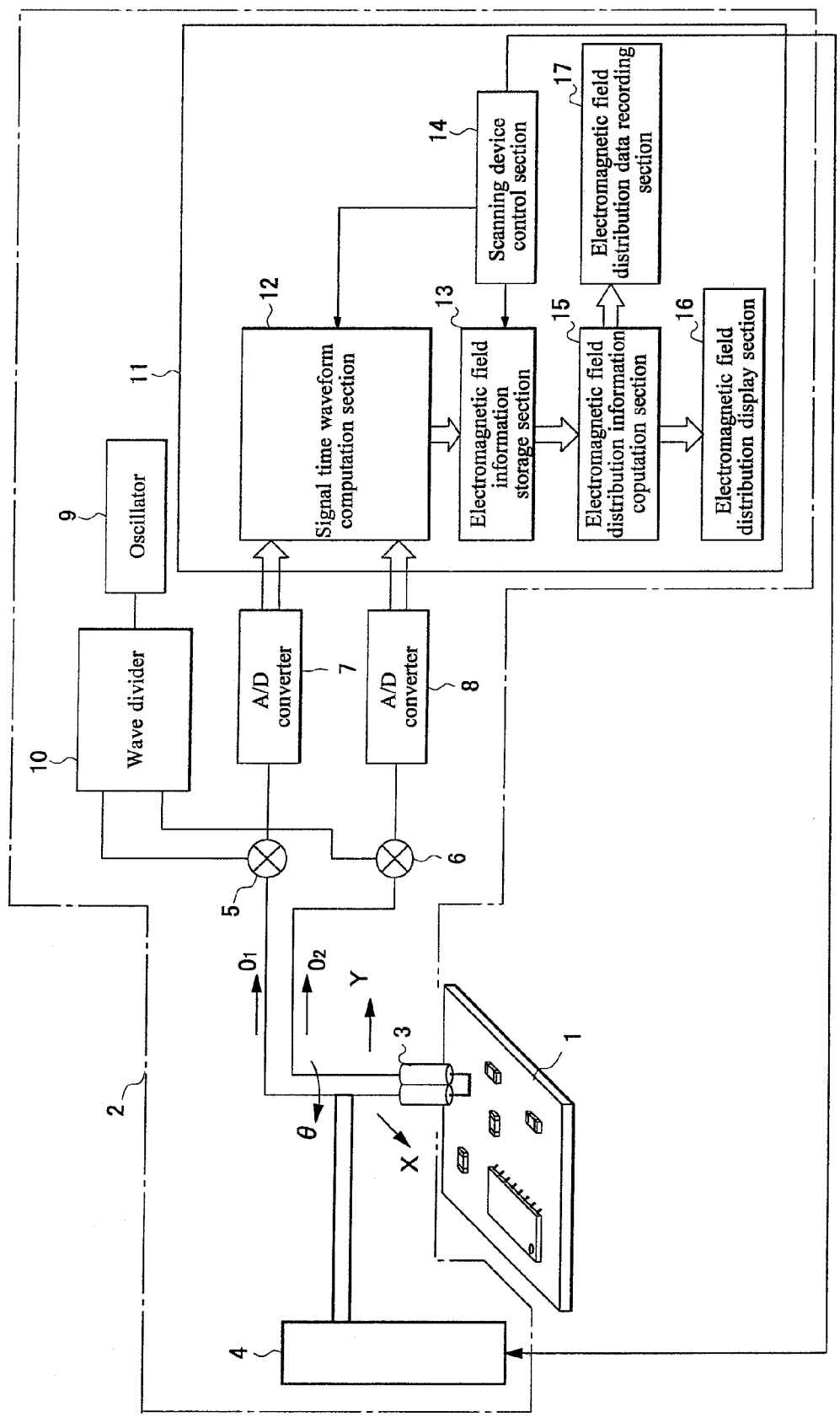
FIG. 1 is a configurational diagram showing an electromagnetic field distribution measuring apparatus in a first embodiment of the present invention.

1 . . . Object to be measured
2 . . . Electromagnetic field distribution measuring apparatus
3 . . . Electromagnetic field sensor (probe)
4 . . . Sensor scanning device
5, 6 . . . Mixer
7, 8 . . . A/D converter
9 . . . Oscillator
10 . . . Wave divider
11 . . . Computer unit
12 . . . Signal time waveform computation section
13 . . . Electromagnetic field information storage section
14 . . . Scanning device control section
15 . . . Electromagnetic field distribution information computation section
16 . . . Electromagnetic field distribution display section
17 . . . Electromagnetic field distribution data recording section
31 . . . Loop antenna
32, 33 . . . Coaxial cable
34, 35 . . . Connector
100 . . . Electromagnetic field distribution measuring apparatus
101 . . . Electric field sensor (probe)
103 . . . Electric field information storage section
105 . . . Electric field distribution information computation section
106 . . . Electric field distribution display section
111 . . . Monopole antenna
112 . . . Coaxial cable
113 . . . Connector
200 . . . Electromagnetic field distribution measuring apparatus
201 . . . Magnetic field sensor (probe)
203 . . . Magnetic field information storage section
205 . . . Magnetic field distribution information computation section
206 . . . Magnetic field distribution display section
300 . . . Electromagnetic field distribution measuring apparatus
309 . . . Oscillator
312 . . . Signal time waveform computation section
313 . . . Electromagnetic field information storage section
314 . . . Scanning device control section
315 . . . Electromagnetic field distribution information computation section
316 . . . Electromagnetic field distribution display section
317 . . . Electromagnetic field distribution data recording section
400 . . . Electromagnetic field distribution measuring apparatus
409 . . . Oscillator
413 . . . Electromagnetic field information storage section
414 . . . Scanning device control section
415 . . . Electromagnetic field distribution information computation section
416 . . . Electromagnetic field distribution display section
417 . . . Electromagnetic field distribution data recording section
500 . . . Electromagnetic field distribution measuring apparatus
509 . . . Oscillator
513 . . . Electromagnetic field information storage section
514 . . . Scanning device control section
515 . . . Electromagnetic field distribution information computation section
516 . . . Electromagnetic field distribution display section
517 . . . Electromagnetic field distribution data recording section

DETAILED DESCRIPTION OF THE DRAWING

An embodiment of the present invention will be described with reference to the drawings.

FIG. 1 is a configurational diagram showing an electromagnetic field distribution measuring apparatus in a first embodiment of the present invention. In FIG. 1, reference numeral 1 denotes an object to be measured, e.g., a circuit board of an electronic device, and reference numeral 2 denotes an electromagnetic field distribution measuring apparatus which measures in the vicinity of the object 1 to be measured the distribution of an electromagnetic field radiated from the object 1 to be measured.

The object 1 to be measured may be any of electronic components mounted on a circuit board, and may be any of circuit blocks constituted by groups of electronic components.

The electromagnetic field distribution measuring apparatus 2 is constituted by a scanning electromagnetic field sensor (probe) 3, a sensor scanning device 4, mixers 5 and 6, analog/digital (hereinafter referred to as A/D) converters 7 and 8, an oscillator 9, a wave divider 10 and a computer unit 11.

The computer unit 11 has a signal time waveform computation section 12, an electromagnetic field information storage section 13, a scanning device control section 14, an electromagnetic field distribution information computation section 15, an electromagnetic field distribution display section 16 and an electromagnetic field distribution data recording section 17.

The electromagnetic field distribution measuring apparatus 2 measures the distribution of the intensity of a vicinal electromagnetic field in a virtual plane at a predetermined distance from an upper surface of the object 1 to be measured. During intensity distribution measurement, the object 1 to be measured is in an operating state and the distribution of the intensity of the electromagnetic field formed by electromagnetic waves in a predetermined frequency channel radiated during the operation of the object 1 to be measured is measured by the electromagnetic field distribution measuring apparatus 2. In this embodiment, the above-mentioned frequency channel is assumed to be a frequency band having a predetermined frequency bandwidth about a predetermined frequency (e.g., a ±0.1 MHz bandwidth).

Figure 2:
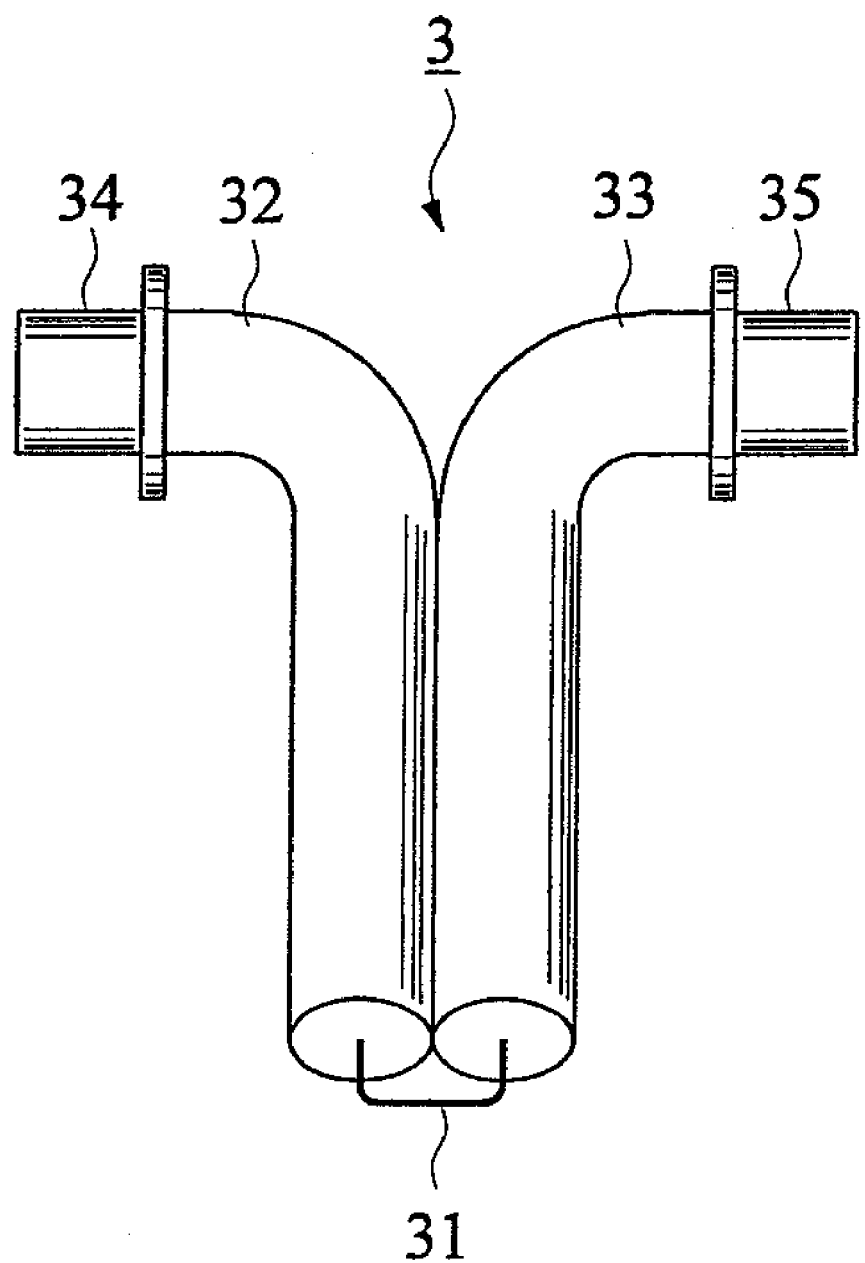
FIG. 2 is a configurational diagram showing an electromagnetic field sensor in the first embodiment of the present invention.

The scanning electromagnetic field sensor 3 has a loop antenna 31, as shown in FIG. 2. The loop antenna 31 is a conductor in looped form having no shield. In this embodiment, the loop antenna 31 is formed as a rectangular loop antenna such as to be capable of being brought close to the object 1 to be measured. Opposite ends of the loop antenna 31 are respectively connected to central conductors of coaxial cables 32 and 33. Connectors 34 and 35 are provided at the other ends of the coaxial cables 32 and 33.

The connectors 34 and 35 are connected to the mixers 5 and 6 via coaxial cables (not shown). The characteristic impedances of one end and the other end of the loop antenna 31 match the characteristic impedances of the mixers 5 and 6. The electromagnetic field sensor 3 in this embodiment is formed by working a coaxial cable having an outer conductor formed of copper, a dielectric formed of a fluororesin, a characteristic impedance of 50Ω and a diameter of about 1 mm.

To each of the mixers 5 and 6, a reference signal for frequency conversion generated by the oscillator 9 is input via the wave divider 10. Output terminals of the mixers 5 and 6 are connected to the A/D converters 7 and 8. The input signals to the A/D converters 7 and 8 are down-converted into digital data. The data converted by the A/D converters 7 and 8 is input to the signal time waveform computation section 12 of the computer unit 11.

The signal time waveform computation section 12 and the electromagnetic field information storage section 13 operate on the basis of control signals from the scanning device control section 14 to compute the intensity and direction of an electric field and the intensity and direction of a magnetic field in a predetermined measurement plane set in the vicinity of the object 1 to be measured with respect to each of sets of measurement coordinates at which measurements are to be made, and to store the computation results for predetermined time $T_0$ with respect to each of the sets of measurement coordinates. The results of measurement of the intensity and direction of the electric field and the intensity and direction of the magnetic field including variation with time are thereby stored in the electromagnetic field information storage section 13 with respect to each of the sets of measurement coordinates at which measurements have been made.

The scanning device control section 14 controls drive of the sensor scanning device 4 so that the predetermined measurement plane set in the vicinity of the object 1 to be measured is scanned with the loop antenna 31.

The electromagnetic field distribution information computation section 15 computes an amplitude probability of each of the electric field strength and the magnetic field strength with respect to each set of measurement coordinates by using predetermined threshold values on the basis of the measurement results stored in the electromagnetic field information storage section 13, and stores as an electromagnetic field distribution the distribution of amplitude probability over all the measurement coordinates with respect to each threshold value. The computed electromagnetic field distribution is represented by data with time on the abscissa and amplitude probability on the ordinate for each measurement coordinate.

The electromagnetic field distribution display section 16 maps and displays the electromagnetic field distribution stored in the electromagnetic field distribution information computation section 15.

The electromagnetic field distribution data recording section 17 records on an easily portable computer-readable information recording medium such as a compact disk (CD), a DVD or a flexible magnetic disk the data on the electromagnetic field distribution information stored in the electromagnetic field distribution information computation section 15.

Figure 3:
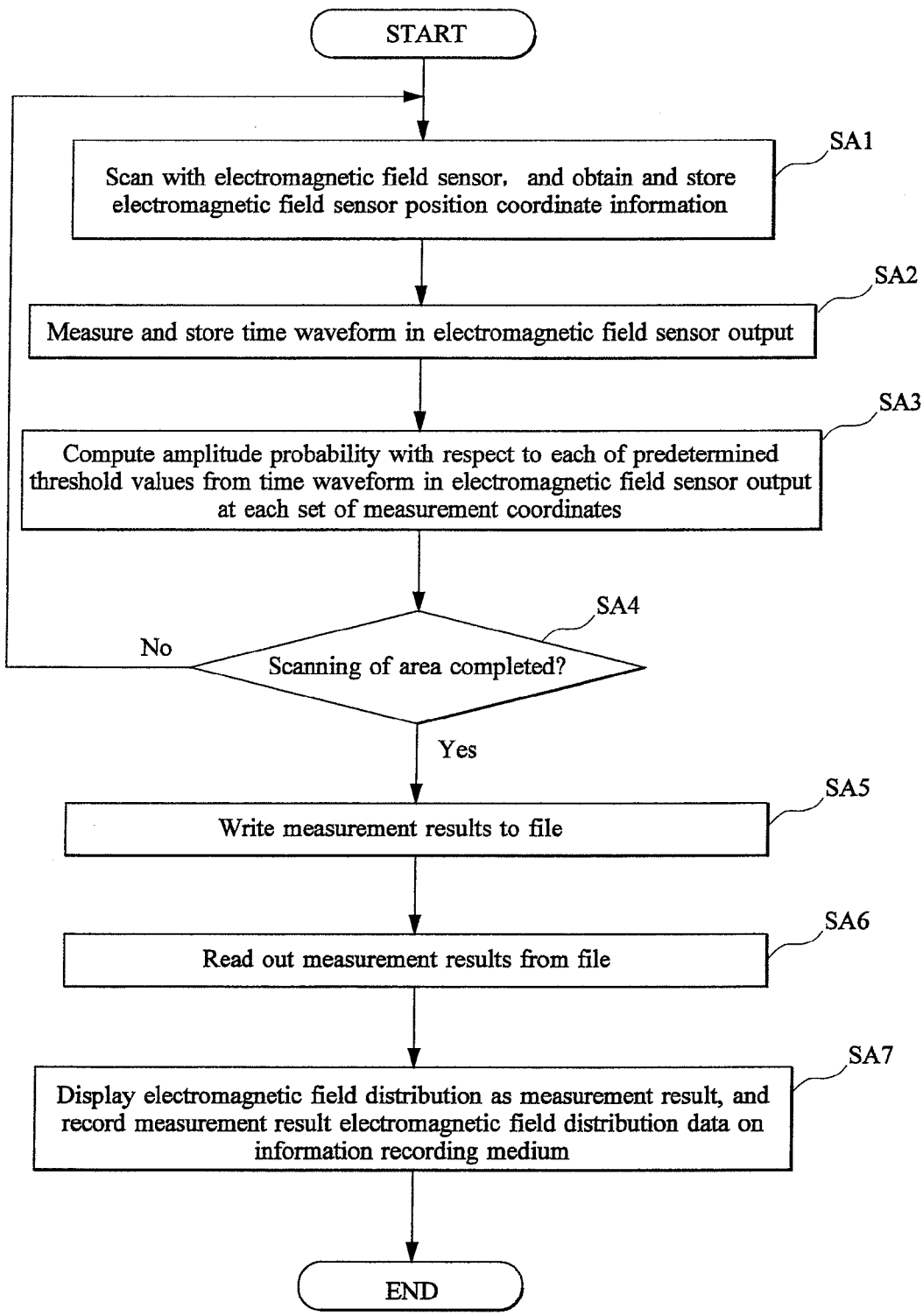
FIG. 3 is a flowchart for explaining an electromagnetic field distribution measuring method in the first embodiment of the present invention.

The operation of the electromagnetic field distribution measuring apparatus in this embodiment will next be described with reference to a flowchart shown in FIG. 3. FIG. 3 is a flowchart for explaining programmed processing in the computer unit 11.

When measurement is started, the scanning device control section 14 performs scanning with the electromagnetic field sensor 3 in a predetermined measurement plane set in the vicinity of the object 1 to be measured, obtains information on the coordinates at which the electromagnetic field sensor 3 is positioned, stores the information in the electromagnetic field information storage section 13 (SA1), computes, by means of the signal time waveform computation section 12, the intensity and direction of an electric field and the intensity and direction of a magnetic field with respect to each of sets of measurement coordinates at which measurements are to be made in the predetermined measurement plane set in the vicinity of the object 1 to be measured, and stores the computation results for predetermined time $T_0$ with respect to each of the sets of measurement coordinates (SA2) in the electromagnetic field information storage section 13. The results of measurement of the intensity and direction of the electric field and the intensity and direction of the magnetic field including variation with time are thereby stored in the electromagnetic field information storage section 13 with respect to each of the sets of measurement coordinates at which measurements have been made.

Subsequently, the electromagnetic field distribution information computation section 15 computes an amplitude probability of each of the electric field strength and the magnetic field strength with respect to each set of measurement coordinates on the basis of the measurement results stored in the electromagnetic field information storage section 13 by using one or more predetermined threshold values with which measurements are to be made, and stores as an electromagnetic field distribution the distribution of amplitude probability over all the measurement coordinates with respect to each threshold value (SA3). In this embodiment, the distribution of amplitude probability of each of the electric field strength and the magnetic field strength is stored as an electromagnetic field distribution, and each of the distributions of the electric field strength and the magnetic field strength can be selectively displayed at the time of display of the measurement results.

The computer unit 11 then determines whether or not scanning of the area has been completed, that is, measurements at all the coordinates at which measurements are to be made have been completed (SA4). In the case of incompletion, the computer unit 11 moves the process to the above-described processing in SA1. In the case of completion, the computer unit 11 writes to a file the information on the results of measurement of the electromagnetic field distribution stored in the electromagnetic field distribution information computation section 15 (SA5). Thereafter, the electromagnetic field distribution display section 16 reads out this file (SA6) and displays the electromagnetic field distribution measurement results. Simultaneously, the electromagnetic field distribution data recording section 17 records on an information recording medium the data on the electromagnetic field distribution measurement results (SA7). At the time of display of the electromagnetic field distribution measurement results, the threshold values for the amplitude probability can be designated and displayed.

Figure 4:
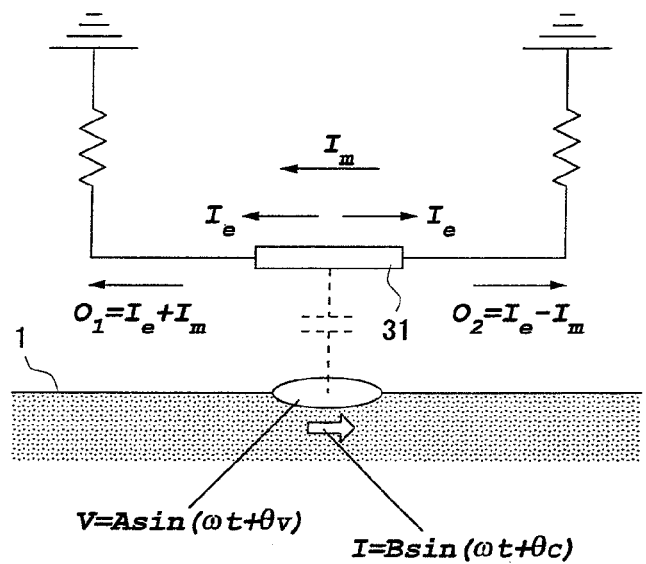
FIG. 4 is a diagram for explaining the principle of measurement in the first embodiment of the present invention.
Figure 5:
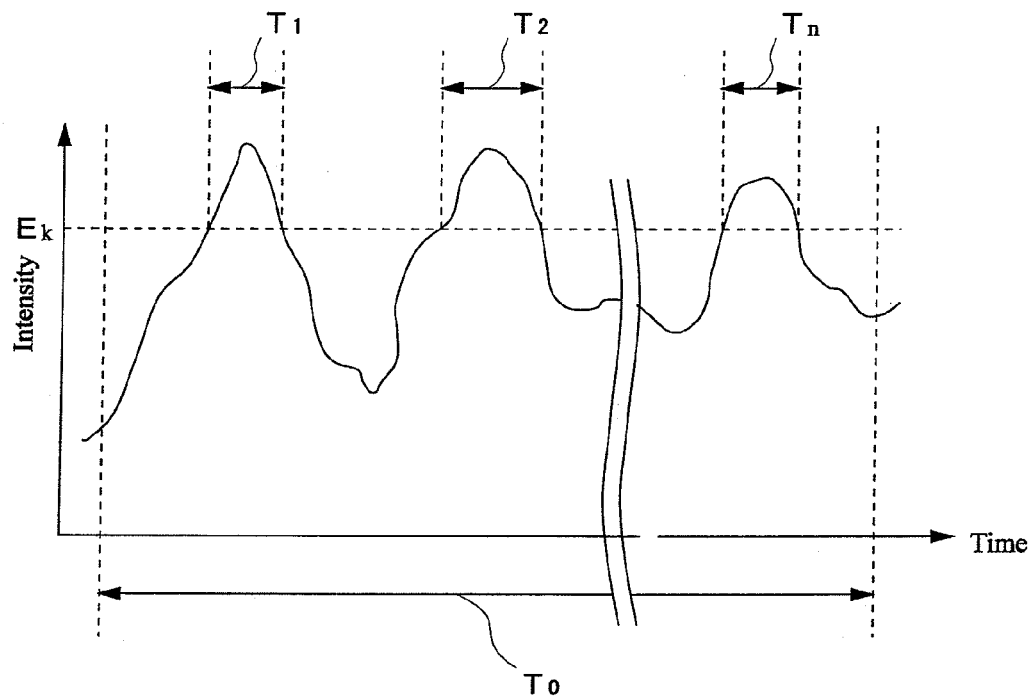
FIG. 5 is a diagram for explaining a method of computing an amplitude probability in the first embodiment of the present invention.

This embodiment will be described with reference to FIGS. 4 and 5. FIG. 4 is a diagram showing the principle of measurement in accordance of the present invention. FIG. 5 is a diagram for explaining a method of computing the amplitude probability.

The principle of measurement in accordance of the present invention will be described with reference to FIG. 4. It is assumed that, as shown in FIG. 4, a voltage V (=A sin(ωt+θv)) and a current I (=B sin(ωt+θc)) at a certain frequency exist at a point on the object 1 to be measured. A small conductor 31 in line form terminated at its opposite ends with impedances equal to each other is placed right above this point. A current (hereinafter referred to as an electric field component current) Ie is then generated in the conductor 31 by electric field coupling with the voltage V, and a current (hereinafter referred as a magnetic field component current) Im is also generated in the conductor 31 by magnetic field coupling with the current I. Accordingly, output currents O1 and O2 from the opposite ends of the conductor 31 are currents obtained by combining the electric field component current Ie and the magnetic field component current Im. The electric field component currents Ie output from the opposite ends of the conductor 31 are in phase with each other, while the magnetic field component currents Im are phase opposition to each other. That is, the electric field component current Ie changes according to the orientation of the conductor 31, while the magnetic field component current Im is independent of the orientation of the conductor 31. In the present invention, this fact is utilized to compute the electric field component current and the magnetic field component current on the basis of the plurality of output currents differing in output direction from each other and to thereby compute the electric field strength and the magnetic field strength at the measurement coordinates at which the conductor 31 is positioned.

The method will be described further in detail below.

The output currents O1 and O2 output from the opposite ends of the conductor 31 as shown in FIG. 4 are expressed by equations (1) and (2), respectively.

$$O1 = \alpha A \sin(\omega t + \theta v) + \beta B \sin(\omega t + \theta c) \quad (1)$$

$$O2 = \alpha A \sin(\omega t + \theta v) - \beta B \sin(\omega t + \theta c) \quad (2)$$

where α and β are coefficients. Therefore the electric field component current Ie and the magnetic field component current Im flowing in the conductor 31 can be computed by obtaining the sum of and the difference between the output currents O1 and O2 at the opposite ends, as in equations (3) and (4).

$$Ie = (O1 + O2)/2 \quad (3)$$

$$Im = (O1 - O2)/2 \quad (4)$$

The electromagnetic field strength at the set of measurement coordinates at which the conductor 31 is positioned can be measured by using the small conductor 31 as a probe.

Also, the amplitude probability of the electric field strength or the magnetic field strength at predetermined coordinates is computed by using the following equation (5).

$$D(E_k) = \frac{\sum_{i=1}^{n} T_i(E_k)}{T_0} \quad (5)$$

where $D(E_k)$ is an amplitude probability; $T_0$ is a time period during which measurements are made at the measurement coordinates; and $T_i$ (i=1 to n, n is a natural number) is a time period during which the measured intensity is continuously above a predetermined threshold value $E_k$. Accordingly, the proportion of a total time period $(T_1 + \ldots + T_n)$ during which the measured intensity is above the threshold value $E_k$ in the measurement time period $T_0$ is computed by equation (5) as the amplitude probability $D(E_k)$ with respect to the threshold value $E_k$.

Figure 6:
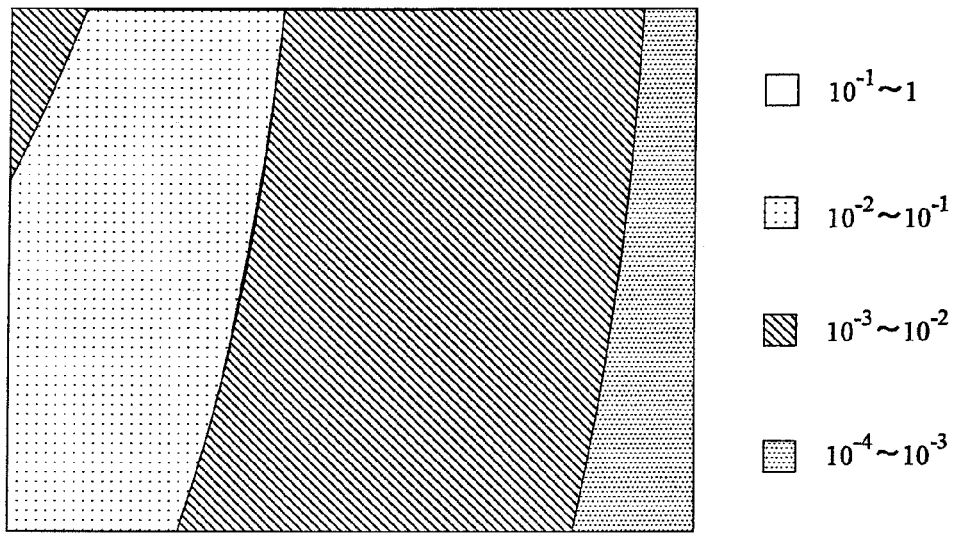
FIG. 6 is a diagram showing an example of display of an electromagnetic field distribution in the first embodiment of the present invention.
Figure 7:
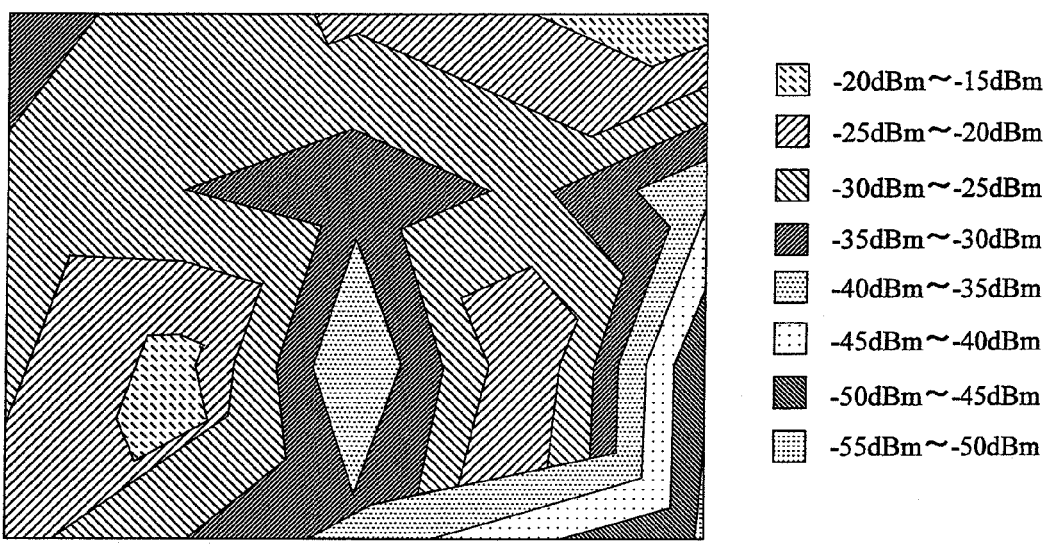
FIG. 7 is a diagram showing an example of display of an electromagnetic field distribution in the first embodiment of the present invention.

From the amplitude probability $D(E_k)$ computed as described above, the distribution of the amplitude probability $D(E_k)$ of excess of the measured intensity of the electric field or the magnetic field over the predetermined threshold value (e.g., −50 dBm) can be mapped and displayed as an electromagnetic field distribution, for example, as shown in FIG. 6, or the distribution of the measured intensity of the electric field or the magnetic field with the measured amplitude probability $D(E_k)$ exceeding a predetermined value (e.g., $10^{-4}$) is mapped and displayed as an electromagnetic field distribution, as shown in FIG. 7.

FIG. 6 shows a region in the measurement plane in which the amplitude probabilities $D(E_k)$ of excess of the measured strength of the electric field or the magnetic field over −50 dBm is $10^{-4}$ to $10^{-3}$, a region in which the corresponding amplitude probability is $10^{-3}$ to $10^{-2}$, a region in which the corresponding amplitude probability is $10^{-2}$ to $10^{-1}$ and a region in which the corresponding amplitude probability is $10^{-1}$ to 1. FIG. 7 shows a region in the measurement plane in which the output level with the amplitude probabilities $D(E_k)$ exceeding $10^{-4}$ is −55 to −50 dBm, a region in which the corresponding output level is −50 to −45 dBm, a region in which the corresponding output level is −45 to −40 dBm, a region in which the corresponding output level is −40 to −35 dBm, a region in which the corresponding output level is −35 to −30 dBm, a region in which the corresponding output level is −30 to −25 dBm, a region in which the corresponding output level is −25 to −20 dBm and a region in which the corresponding output level is −20 to −15 dBm.

Thus, in the case of measurement in a vicinal electromagnetic field in which the measured intensity of the electric field or the magnetic field fluctuates, a signal is detected during the predetermined time period $T_0$ at each of a plurality of sets of measurement coordinates in a predetermined measurement plane in a space in the vicinity of the object 1 to be measured; the intensity of the electric field or the magnetic field at each set of measurement coordinates is computed for the predetermined time period $T_0$; and the electromagnetic field distribution in the measurement plane at each set of measurement coordinates including variation with time during the predetermined time period $T_0$ is computed on the basis of the computed intensity. Thus, the electromagnetic field distribution can be measured while considering variation with time and reducing the influence of noise floor (thermal noise).

Figure 8:
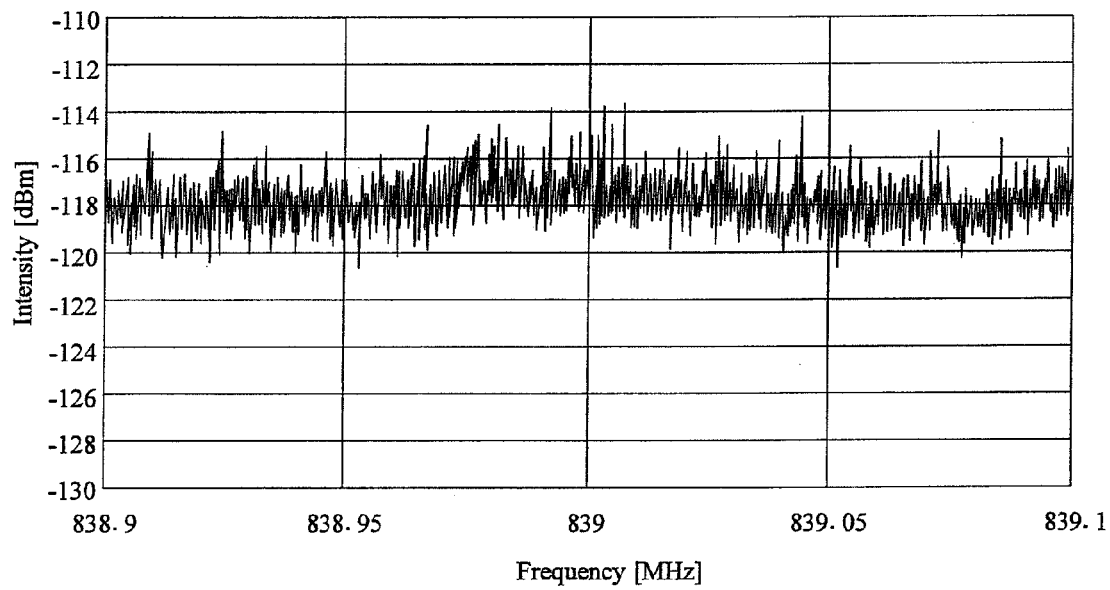
FIG. 8 is a diagram showing an example of the results of measurement of the spectrum of the electromagnetic field intensity.
Figure 9:
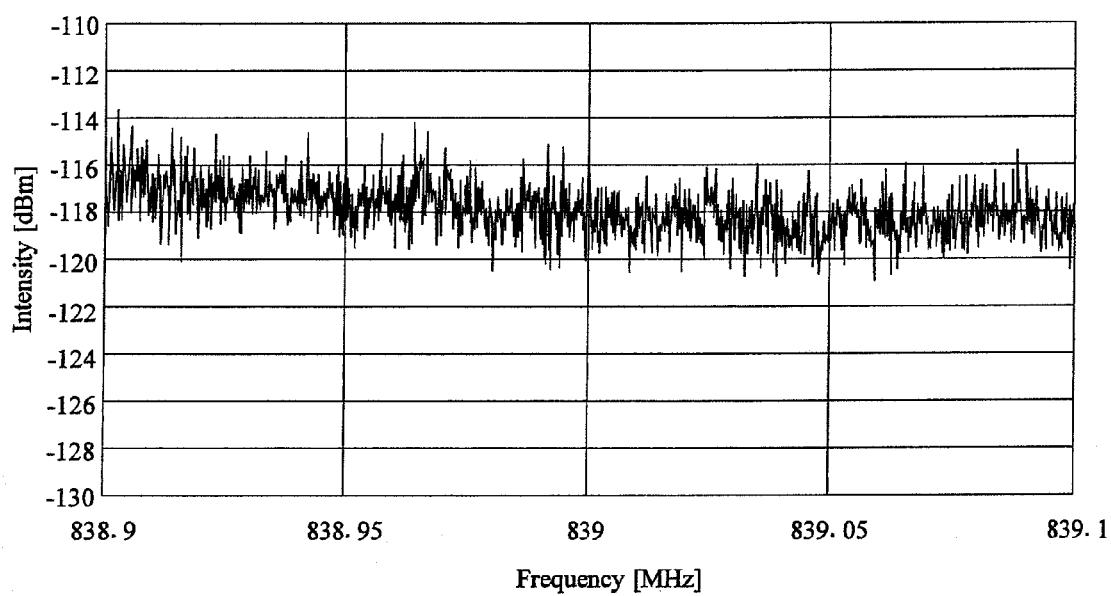
FIG. 9 is a diagram showing an example of the results of measurement of the spectrum of the electromagnetic field intensity.
Figure 10:
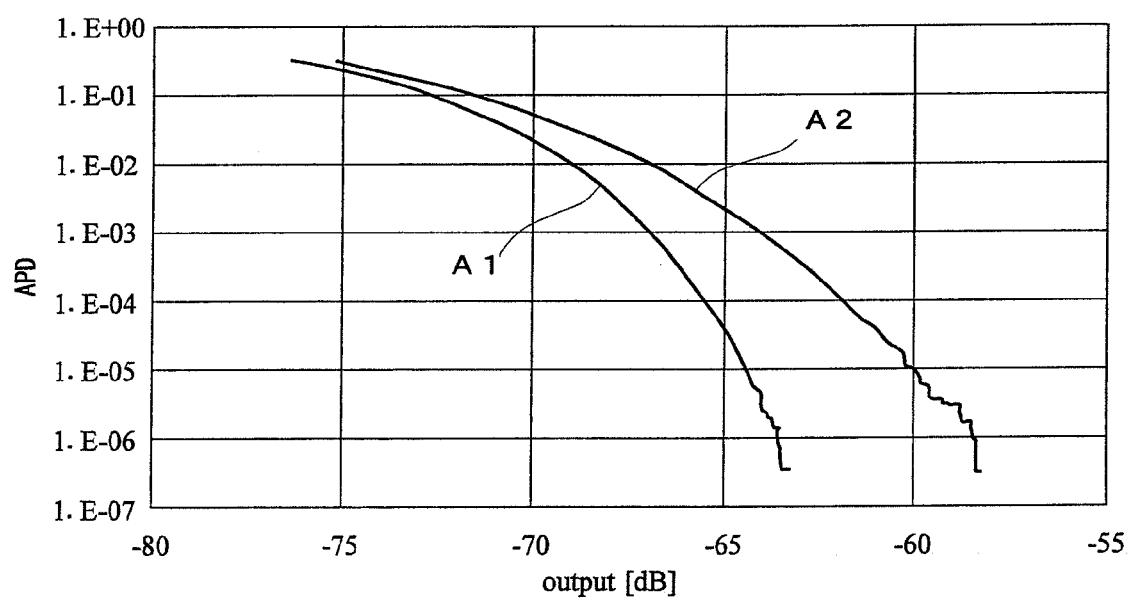
FIG. 10 is a diagram showing an example of an amplitude probability distribution of the electromagnetic field intensity.

For example, measurement results such as shown in FIGS. 8 and 9 were obtained by measuring the spectrums in two different portable telephone models. FIG. 8 shows spectral characteristics of the first portable telephone, and FIG. 9 shows spectral characteristics of the second portable telephone. In each of FIGS. 8 and 9, the abscissa represents the frequency and the ordinate represents the output. No definite difference can be recognized between the spectral characteristics of the two portable telephones when they are compared with each other. However, when the amplitude probability distributions of the electromagnetic field strength output from the two portable telephones are obtained, a definite difference therebetween can be grasped, as shown in FIG. 10. In FIG. 10, A1 indicates the amplitude probability distribution of the first portable telephone; A2 indicates the amplitude probability distribution of the second portable telephone; the abscissa represents the output; and the ordinate represents the amplitude probability. In FIG. 10, "IE+100" denotes a probability 1/1 E+00, i.e., one occurrence for one in the number of pulses of the spectrum, and "1 E-07" denotes a probability 1/1E+07, i.e., one occurrence for 1E+07($10^7$). Also, FIG. 10 shows the distribution of probability of excess of the spectrum over a predetermined intensity set as a threshold value in the above-mentioned frequency band in a predetermined certain time period. For example, the probability of output of an output value equal to or higher than −60 dBm from the second portable telephone is 1/1E-05 (one occurrence for 1E+05).

Further, even in the case of measurement of the influence on the receiving sensitivity of a digital communication device according to this embodiment, the electromagnetic field distribution is measured by considering variation with time as well as factors for the measured intensity of the electric field or the magnetic field and, therefore, the relationship between mapping of the electromagnetic field distribution and the receiving sensitivity can be made definite.

In the above-described embodiment, the amplitude probability distribution of the electromagnetic field strength is grasped as an electromagnetic field distribution while considering variation with time. However, the average of the electromagnetic field intensity during the measurement time period $T_0$ may be measured with respect to each set of measurement coordinates, and the distribution over all the measurement coordinates may be measured as an electromagnetic field distribution by using the averages. Grasping of the distribution considering variation with time can also be performed in this way.

In the above-described embodiment, a virtual plane at a predetermined distance from the upper surface of the object 1 to be measured is set as a measurement plane. However, an electromagnetic field distribution may be measured by setting as a measurement plane surfaces surrounding the object 1 to be measured, e.g., the six surfaces of a rectangular block surrounding the object 1 to be measured, and the measurement results may be mapped and displayed.

Figure 11:
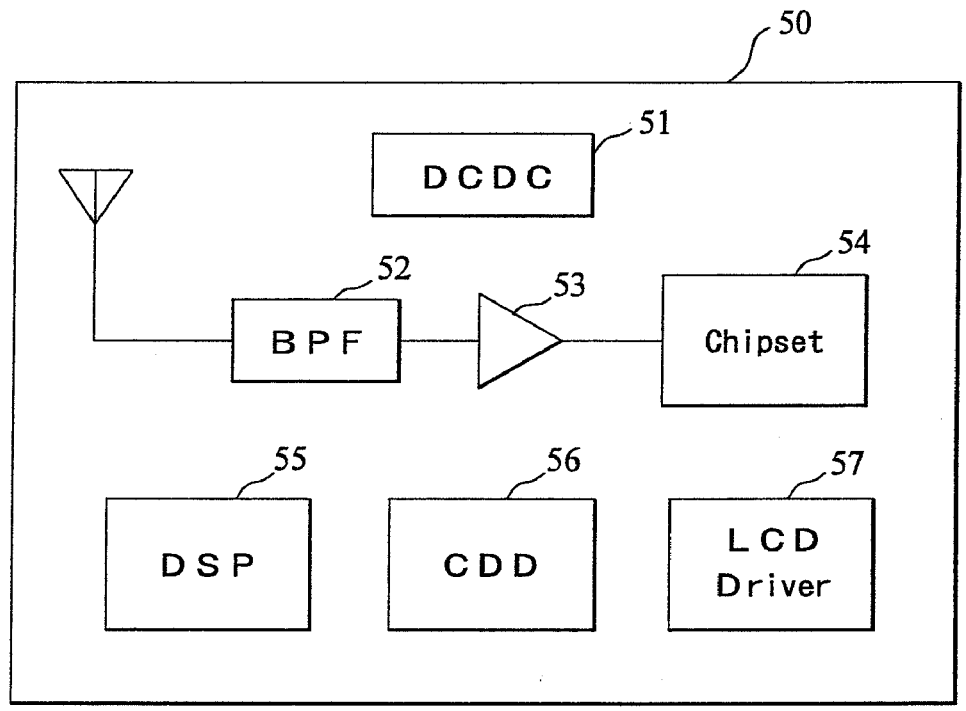
FIG. 11 is a diagram for explaining measurement of an electromagnetic field distribution on an electronic component in a single state.
Figure 12:
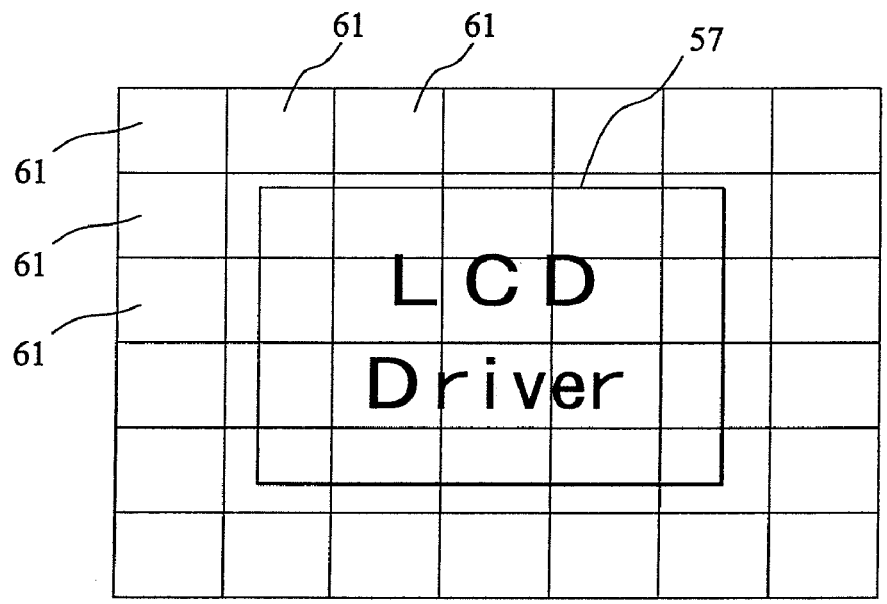
FIG. 12 is a diagram for explaining measurement of an electromagnetic field distribution on an electronic component in a single state.

Electromagnetic field distribution data on each of electronic components such as ICs and composite module components probable to generate noise in a plurality of circuit blocks 51 to 57 constituting an electronic device 51 as shown in FIG. 11 may be obtained with respect to its single state and mapped by being divided into a plurality of areas 61 in matrix form as shown in FIG. 12. The data may be stored or recorded on an information recording medium and provided to a user by attaching the information recording medium to the measured electronic component. Thus, the above-described electromagnetic field distribution measurement is performed on an electronic component in a single state such as an IC or a composite module component provided as the object 1 to be measured, and an information recording medium on which electromagnetic field distribution data obtained as measurement results are stored or recorded is provided to a user together with the electronic component treated as the measured object 1, thereby enabling the user to know from which portion of the electronic component electromagnetic waves most probable to become noise are generated, and to design an electronic circuit or an electronic device using the electronic component by considering the knowledge. Also, the electromagnetic field distribution data on the electronic component may be stored on an RF tag having a well-known nonvolatile memory, and the RF tag may be, for example, attached or mounted on or embedded in the electronic component.

The above-described electromagnetic field distribution measuring apparatus can be easily configured by preparing an information recording medium on which the above-described computer program is recorded and by using a general-purpose computer unit.

A second embodiment of the present invention will be described.

Figure 13:
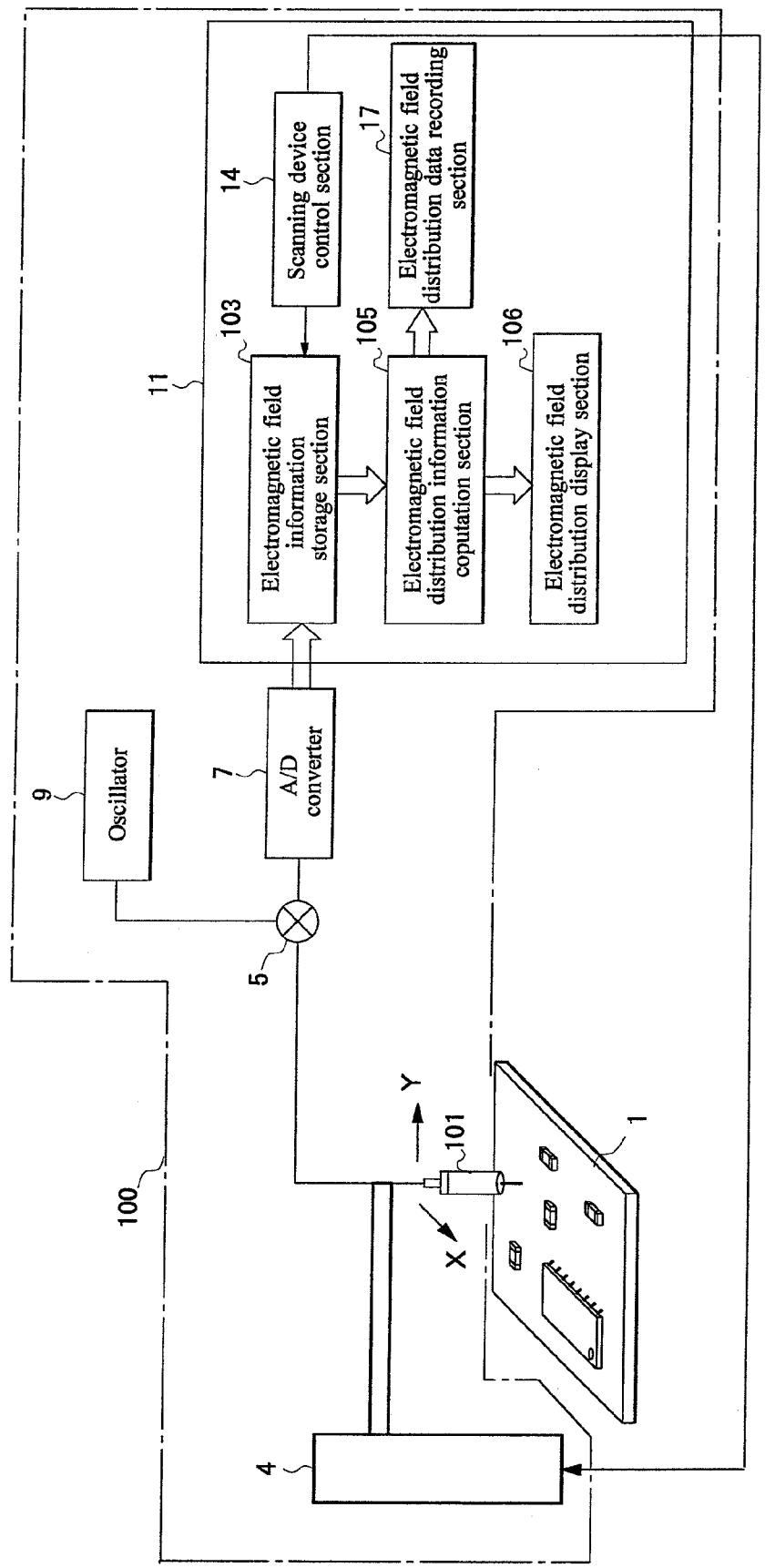
FIG. 13 is a configurational diagram showing an electromagnetic field distribution measuring apparatus in a second embodiment of the present invention.

FIG. 13 is a configurational diagram showing an electromagnetic field distribution measuring apparatus in the second embodiment of the present invention. In FIG. 13, the same components as those of the first embodiment described above are indicated by the same reference numerals. The difference between the above-described first embodiment and the second embodiment resides in that an electromagnetic field distribution measuring apparatus 100 which measures in the vicinity of an object 1 to be measured the distribution of an electric field radiated from the object 1 to be measured is constructed in the second embodiment.

The electromagnetic field distribution measuring apparatus 100 is constituted by a scanning electric field sensor (probe) 101, a sensor scanning device 4, a mixer 5, an A/D converter 7, an oscillator 9 and a computer unit 11.

The computer unit 11 has an electric field information storage section 103, a scanning device control section 14, an electric field distribution information computation section 105, an electric field distribution display section 106 and an electromagnetic field distribution data recording section 17.

The electromagnetic field distribution measuring apparatus 100 measures the distribution of the intensity of an electric field in the vicinity of the object 1 to be measured. During intensity distribution measurement, the object 1 to be measured is in an operating state and the distribution of the intensity of the electric field formed by electromagnetic waves in a predetermined frequency channel radiated during the operation of the object 1 to be measured is measured by the electromagnetic field distribution measuring apparatus 100. In this embodiment, the above-mentioned frequency channel is assumed to be a frequency band of a predetermined frequency bandwidth about a predetermined frequency (e.g., a ±0.1 MHz bandwidth).

Figure 14:
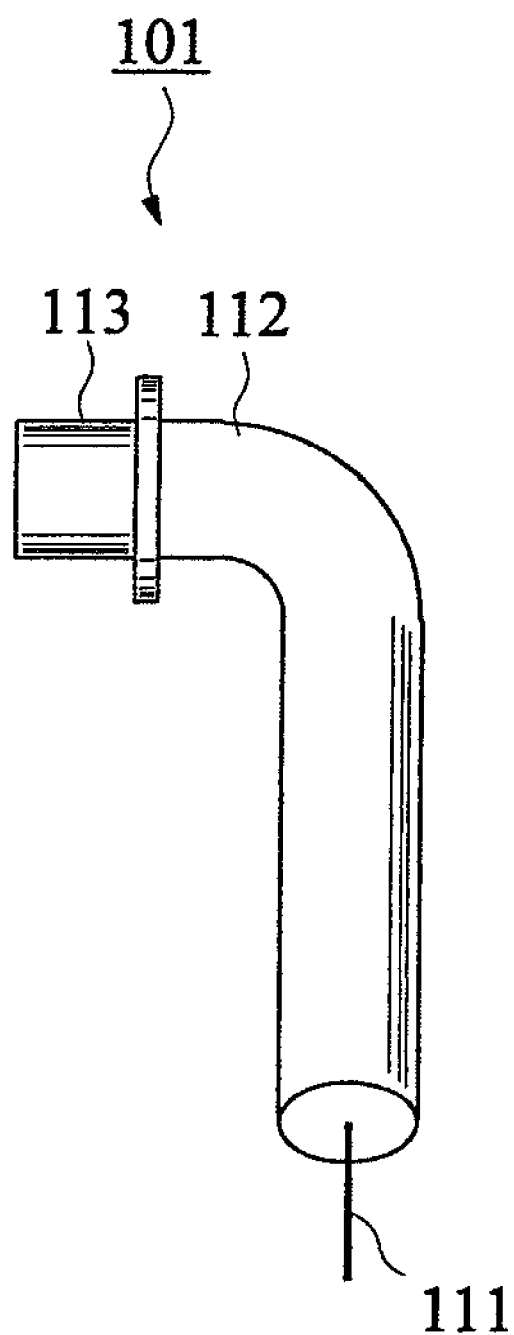
FIG. 14 is a configurational diagram showing an electric field sensor in the second embodiment of the present invention.

The scanning electric field sensor 101 has a monopole antenna 111, as shown in FIG. 14. The monopole antenna 111 is a straight conductor having no shield. The monopole antenna 111 is connected to a central conductor of a coaxial cable 112 at one end of the same. A connector 113 is provided at the other end of the coaxial cable 112.

The connector 113 is connected to the mixer 5 via a coaxial cable (not shown). The characteristic impedance of the monopole antenna 111 and the characteristic impedance of the mixer 5 match each other. The electric field sensor 101 in this embodiment is formed by working a coaxial cable having an outer conductor formed of copper, a dielectric formed of a fluororesin, a characteristic impedance of 50Ω and a diameter of about 1 mm.

A reference signal for frequency conversion generated by the oscillator 9 is input to the mixer 5. An output terminal of the mixer 5 is connected to the A/D converter 7. The input signal to the A/D converter 7 is down-converted into digital data. The data converted by the A/D converter 7 is input to the electric field information storage section 103 of the computer unit 11.

The electric field information storage section 103 operates on the basis of a control signal from the scanning device control section 14 to be supplied with the intensity of an electric field in a predetermined measurement plane set in the vicinity of the object 1 to be measured with respect to each of sets of measurement coordinates at which measurements are to be made, and to store the input results for predetermined time period $T_0$ with respect to each of the sets of measurement coordinates. The results of measurement of the intensity of the electric field including variation with time are thereby stored in the electric field information storage section 103 with respect to each of the sets of measurement coordinates at which measurements have been made.

The scanning device control section 14 controls drive of the sensor scanning device 4 so that the predetermined measurement plane set in the vicinity of the object 1 to be measured is scanned with the monopoleantenna 101.

The electric field distribution information computation section 105 computes an amplitude probability $D(E_k)$ of the electric field strength with respect to each set of measurement coordinates by using predetermined threshold values on the basis of the measurement results stored in the electric field information storage section 103, and stores as an electric field distribution the distribution of amplitude probability $D(E_k)$ over all the measurement coordinates with respect to each threshold value. The method of computing the amplitude probability $D(E_k)$ is the same as that in the first embodiment described above. The electric field distribution computed in this embodiment is represented by data with respect to each set of measurement coordinates with the abscissa representing time and the ordinate representing the amplitude probability value.

The electric field distribution display section 106 maps and displays the electric field distribution stored in the electric field distribution information computation section 105.

The electromagnetic field distribution data recording section 17 records on an easily portable computer-readable information recording medium such as a compact disk (CD), a DVD or a flexible magnetic disk the data on the electric field distribution information stored in the electric field distribution information computation section 105.

Figure 15:
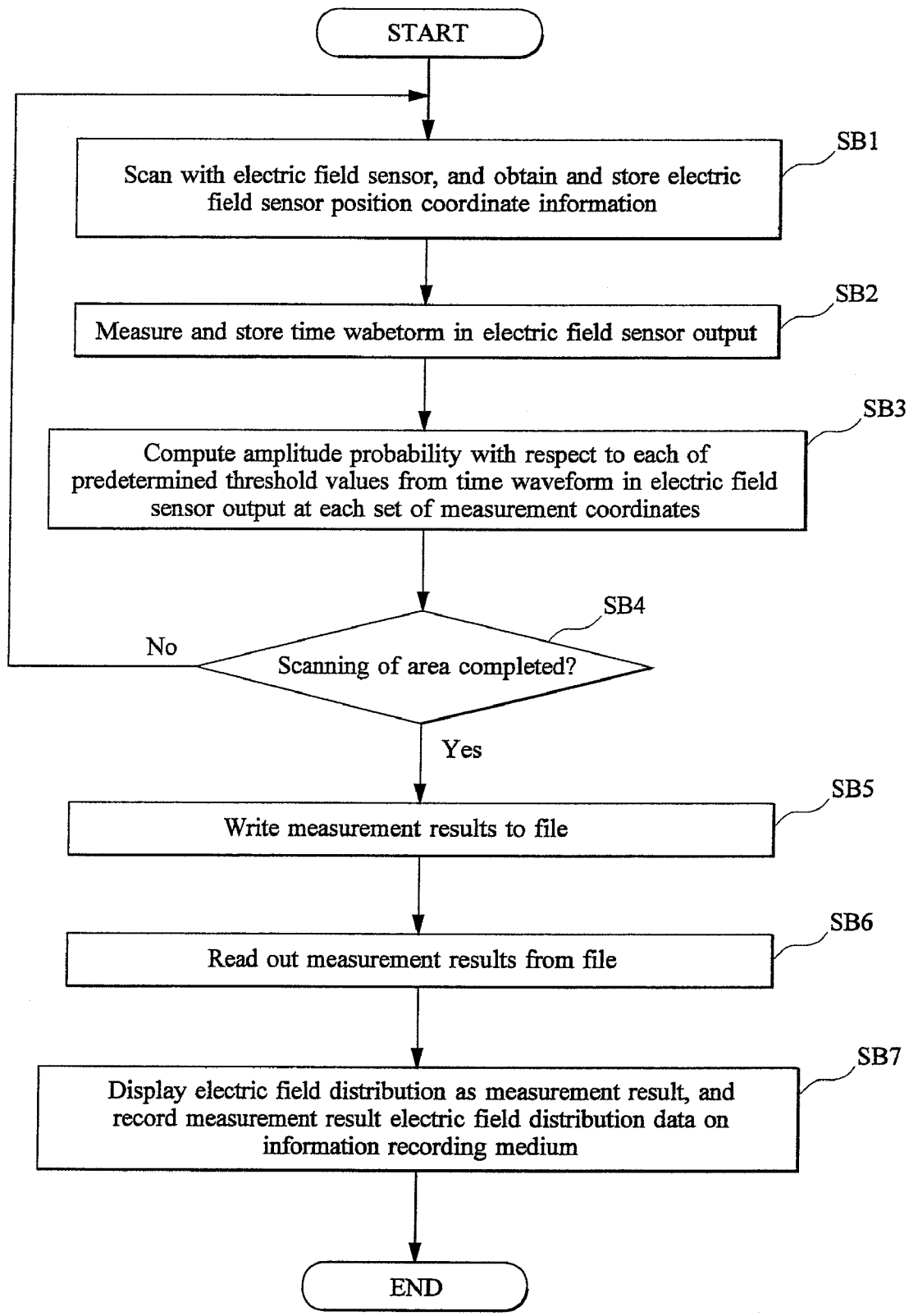
FIG. 15 is a flowchart for explaining an electric field distribution measuring method in the second embodiment of the present invention.

The operation of the electromagnetic field distribution apparatus in this embodiment will next be described with reference to a flowchart shown in FIG. 15. FIG. 15 is a flowchart for explaining programmed processing in the computer unit 11.

When measurement is started, the scanning device control section 14 performs scanning with the electric field sensor 101 in a predetermined measurement plane set in the vicinity of the object 1 to be measured, obtains information on the coordinates at which the electric field sensor 101 is positioned, stores the information in the electric field information storage section 103 (SB1), inputs the intensity of an electric field with respect to each of sets of measurement coordinates at which measurements are to be made in the predetermined measurement plane set in the vicinity of the object 1 to be measured, and stores in the electric field information storage section 103 the input results for predetermined time period $T_0$ with respect to each of the sets of measurement coordinates (SB2). The results of measurement of the intensity of the electric field including variation with time are thereby stored in the electric field information storage section 103 with respect to each of the sets of measurement coordinates at which measurements have been made.

Subsequently, the electric field distribution information computation section 105 computes an amplitude probability of the electric field strength with respect to each set of measurement coordinates on the basis of the measurement results stored in the electric field information storage section 103 by using one or more predetermined threshold values with which measurements are to be made, and stores as an electric field distribution the distribution of amplitude probability over all the measurement coordinates with respect to each threshold value (SB3).

The computer unit 11 then determines whether or not scanning of the desired area has been completed, that is, measurements at all the coordinates at which measurements are to be made have been completed (SB4). In the case of incompletion, the computer unit 11 moves the process to the above-described processing in SB1. In the case of completion, the computer unit 11 writes to a file the information on the results of measurement of the electric field distribution stored in the electric field distribution information computation section 105 (SB5). Thereafter, the electric field distribution display section 106 reads out this file (SB6) and displays the electric field distribution measurement results. Simultaneously, the electromagnetic field distribution data recording section 17 records on an information recording medium the data on the electromagnetic field distribution measurement results (SB7). At the time of display of the electric field distribution measurement results, the threshold value for the amplitude probability can be designated and displayed. Also, an amplitude probability may be designated to display the distribution of the electric field strength corresponding to the designated amplitude probability.

Thus, in the case of measurement in a vicinal electric field in which the electric field intensity fluctuates, a signal is detected during the predetermined time period $T_0$ at each of a plurality of sets of measurement coordinates in a predetermined measurement plane in a space in the vicinity of the object 1 to be measured; the intensity of the electric field at each set of measurement coordinates is computed for the predetermined time period $T_0$; and the electric field distribution in the measurement plane at each set of measurement coordinates including variation with time during the predetermined time period $T_0$ is computed on the basis of the computed intensity. Thus, the electric field distribution can be measured while considering variation with time and reducing the influence of noise floor (thermal noise).

Further, even in the case of measurement of the influence on the receiving sensitivity of a digital communication device according to this embodiment, the electric field distribution is measured by considering variation with time as well as factors for the measured intensity of the electric field and, therefore, the relationship between mapping of the electric field distribution and the receiving sensitivity can be made definite.

In the above-described embodiment, the amplitude probability distribution of the electric field strength is grasped as an electric field distribution while considering variation with time. However, the average of the electric field intensity during the measurement time period $T_0$ may be measured with respect to each set of measurement coordinates, and the distribution over all the measurement coordinates may be measured also as an electric field distribution by using the averages. Grasping of the distribution considering variation with time can also be performed in this way.

In the above-described embodiment, a virtual plane at a predetermined distance from the upper surface of the object 1 to be measured is set as a measurement plane. However, an electromagnetic field distribution may be measured by setting as a measurement plane surfaces surrounding the object 1 to be measured, e.g., the six surfaces of a rectangular block surrounding the object 1 to be measured, and the measurement results may be mapped and displayed.

Electromagnetic field distribution data on each of electronic components such as ICs and composite module components probable to generate noise in a plurality of circuit blocks constituting an electronic device as described above may be obtained with respect to its single state and mapped by being divided into a plurality of areas in matrix form. The data may be stored or recorded on an information recording medium and provided to a user by attaching the information recording medium to the measured electronic component. Also, the electromagnetic field distribution data on the electronic component may be stored on an RF tag having a well-known nonvolatile memory, and the RF tag may be, for example, attached or mounted on or embedded in the electronic component.

Thus, the above-described electromagnetic field distribution measurement is performed on an electronic component in a single state such as an IC or a composite module component provided as the object 1 to be measured, and an information recording medium on which electromagnetic field distribution data obtained as measurement results are stored or recorded is provided to a user together with the electronic component treated as the measured object 1, thereby enabling the user to know from which portion of the electronic component electromagnetic waves most probable to become noise are generated, and to design an electronic circuit or an electronic device using the electronic component by considering the knowledge.

The above-described electromagnetic field distribution measuring apparatus can be easily configured by preparing an information recording medium on which the above-described computer program is recorded and by using a general-purpose computer unit.

A third embodiment of the present invention will be described.

Figure 16:
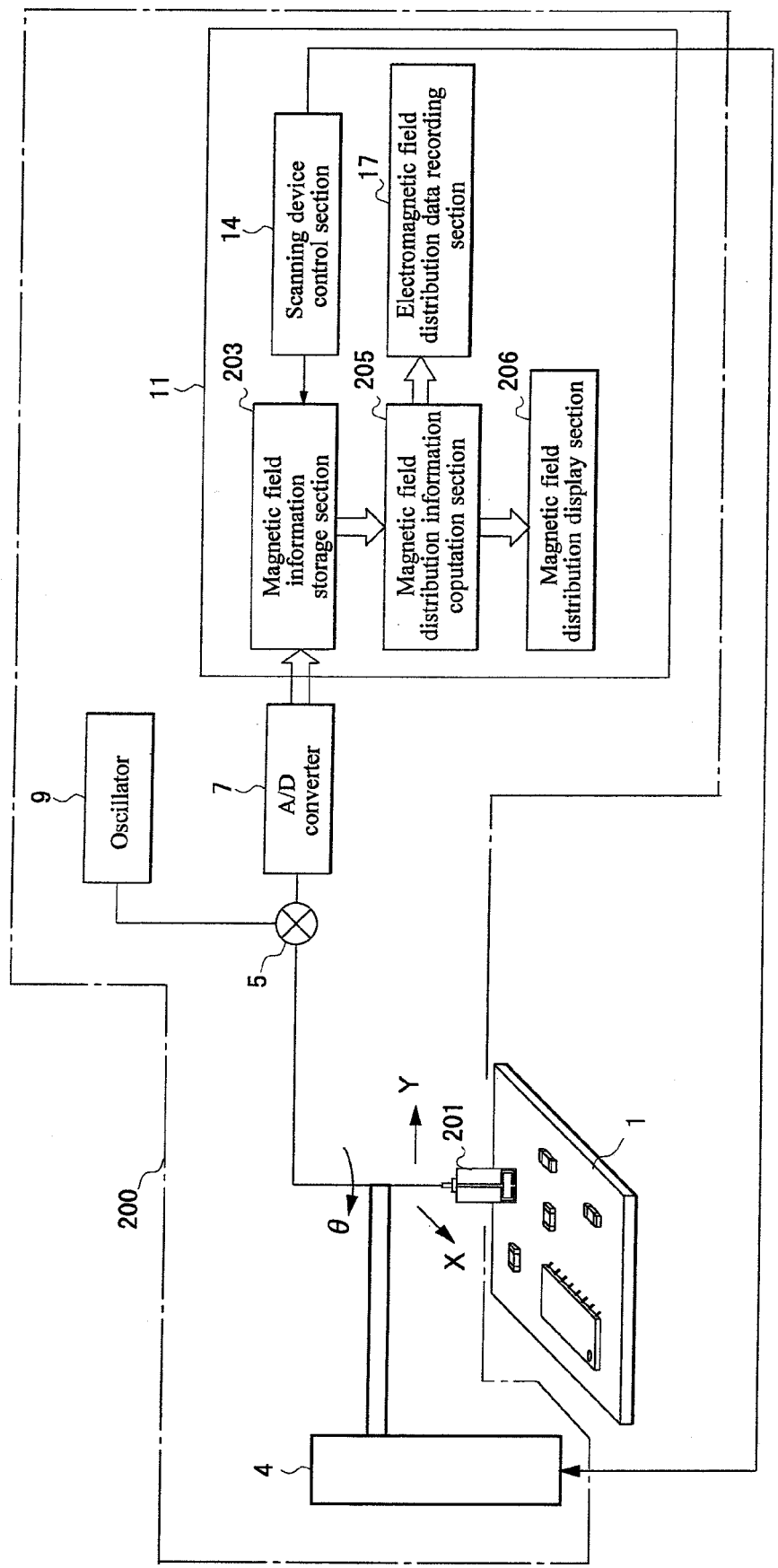
FIG. 16 is a configurational diagram showing an electromagnetic field distribution measuring apparatus in a third embodiment of the present invention.

FIG. 16 is a configurational diagram showing an electromagnetic field distribution measuring apparatus in the third embodiment of the present invention. In FIG. 16, the same components as those of the first embodiment described above are indicated by the same reference numerals. The difference between the above-described first embodiment and the third embodiment resides in that an electromagnetic field distribution measuring apparatus 200 which measures in the vicinity of an object 1 to be measured the distribution of a magnetic field radiated from the object 1 to be measured is constructed in the third embodiment.

The electromagnetic field distribution measuring apparatus 200 is constituted by a scanning magnetic field sensor (probe) 201, a sensor scanning device 4, a mixer 5, an A/D converter 7, an oscillator 9 and a computer unit 11.

The computer unit 11 has a magnetic field information storage section 203, a scanning device control section 14, a magnetic field distribution information computation section 205, a magnetic field distribution display section 206 and an electromagnetic field distribution data recording section 17.

The electromagnetic field distribution measuring apparatus 200 measures the distribution of the intensity of a magnetic field in the vicinity of the object 1 to be measured. During intensity distribution measurement, the object 1 to be measured is in an operating state and the distribution of the intensity of the magnetic field formed by electromagnetic waves in a predetermined frequency channel radiated during the operation of the object 1 to be measured is measured by the electromagnetic field distribution measuring apparatus 500. In this embodiment, the above-mentioned frequency channel is assumed to be a frequency band of a predetermined frequency bandwidth about a predetermined frequency (e.g., a ±0.1 MHz bandwidth).

Figure 17:
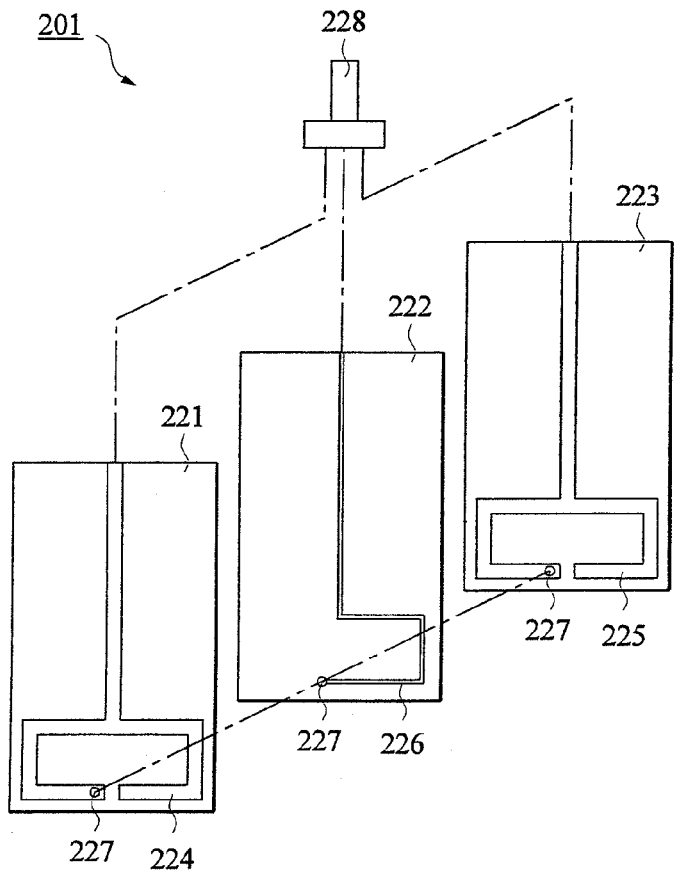
FIG. 17 is a configurational diagram showing a magnetic field sensor in the third embodiment of the present invention.
Figure 18:
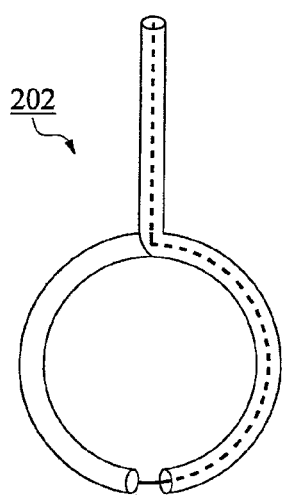
FIG. 18 is a diagram showing another magnetic field sensor in the third embodiment of the present invention.

The scanning magnetic field sensor 201 has a shielded loop structure. In this embodiment, the shielded loop structure is realized by a multilayer printed circuit board, as shown in FIG. 17. More specifically, shielding patterns 224 and 225 are provided on a first layer 221 and a third layer 223, and a pattern 226 corresponding to a core wire is provided on a second layer 222. Connections are made by means of through holes 227 between the patterns 224 to 226. Each of the patterns 224 to 226 is connected to a connector 228 provided at an end of the circuit board. Such a structure functions as a magnetic sensor as well as an ordinary shielded loop antenna such as shown in FIG. 18. While in this embodiment a sensor using a multilayer printed circuit board is used, the present invention can also be implemented by using an ordinary shielded loop antenna 202 such as shown in FIG. 18. However, the sensor using a multilayer printed circuit board can be easily made smaller in size and can be easily brought close to the object to be measured and an improvement in resolution can therefore be expected. For this reason, the sensor using a multilayer printed circuit board is more preferable than the ordinary shielded loop antenna 202.

The connector 228 is connected to the mixer 5 via a coaxial cable (not shown). The characteristic impedance of the magnetic sensor 201 and the characteristic impedance of the mixer 5 match each other.

A reference signal for frequency conversion generated by the oscillator 9 is input to the mixer 5. An output terminal of the mixer 5 is connected to the A/D converter 7. The input signal to the A/D converter 7 is down-converted into digital data. The data converted by the A/D converter 7 is input to the magnetic field information storage section 203 of the computer unit 11.

The magnetic field information storage section 203 operates on the basis of a control signal from the scanning device control section 14 to be supplied with the intensity of a magnetic field in a predetermined measurement plane set in the vicinity of the object 1 to be measured with respect to each of sets of measurement coordinates at which measurements are to be made, and to store the input results for predetermined time period $T_0$ with respect to each of the sets of measurement coordinates. The results of measurement of the intensity of the magnetic field including variation with time are thereby stored in the magnetic field information storage section 203 with respect to each of the sets of measurement coordinates at which measurements have been made.

The scanning device control section 14 controls drive of the sensor scanning device 4 so that the predetermined measurement plane set in the vicinity of the object 1 to be measured is scanned with the magnetic sensor 201.

The magnetic field distribution information computation section 205 computes an amplitude probability $D(E_k)$ of the magnetic field strength with respect to each set of measurement coordinates by using predetermined threshold values on the basis of the measurement results stored in the magnetic field information storage section 203, and stores as a magnetic field distribution the distribution of amplitude probability $D(E_k)$ over all the measurement coordinates with respect to each threshold value. The method of computing the amplitude probability $D(E_k)$ is the same as that in the first embodiment described above. The magnetic field distribution computed in this embodiment is represented by data with respect to each set of measurement coordinates with the abscissa representing time and the ordinate representing the amplitude probability value.

The magnetic field distribution display section 206 maps and displays the magnetic field distribution stored in the magnetic field distribution information computation section 205.

The electromagnetic field distribution data recording section 17 records on an easily portable computer-readable information recording medium such as a compact disk (CD), a DVD or a flexible magnetic disk the data on the magnetic field distribution information stored in the magnetic field distribution information computation section 205.

Figure 19:
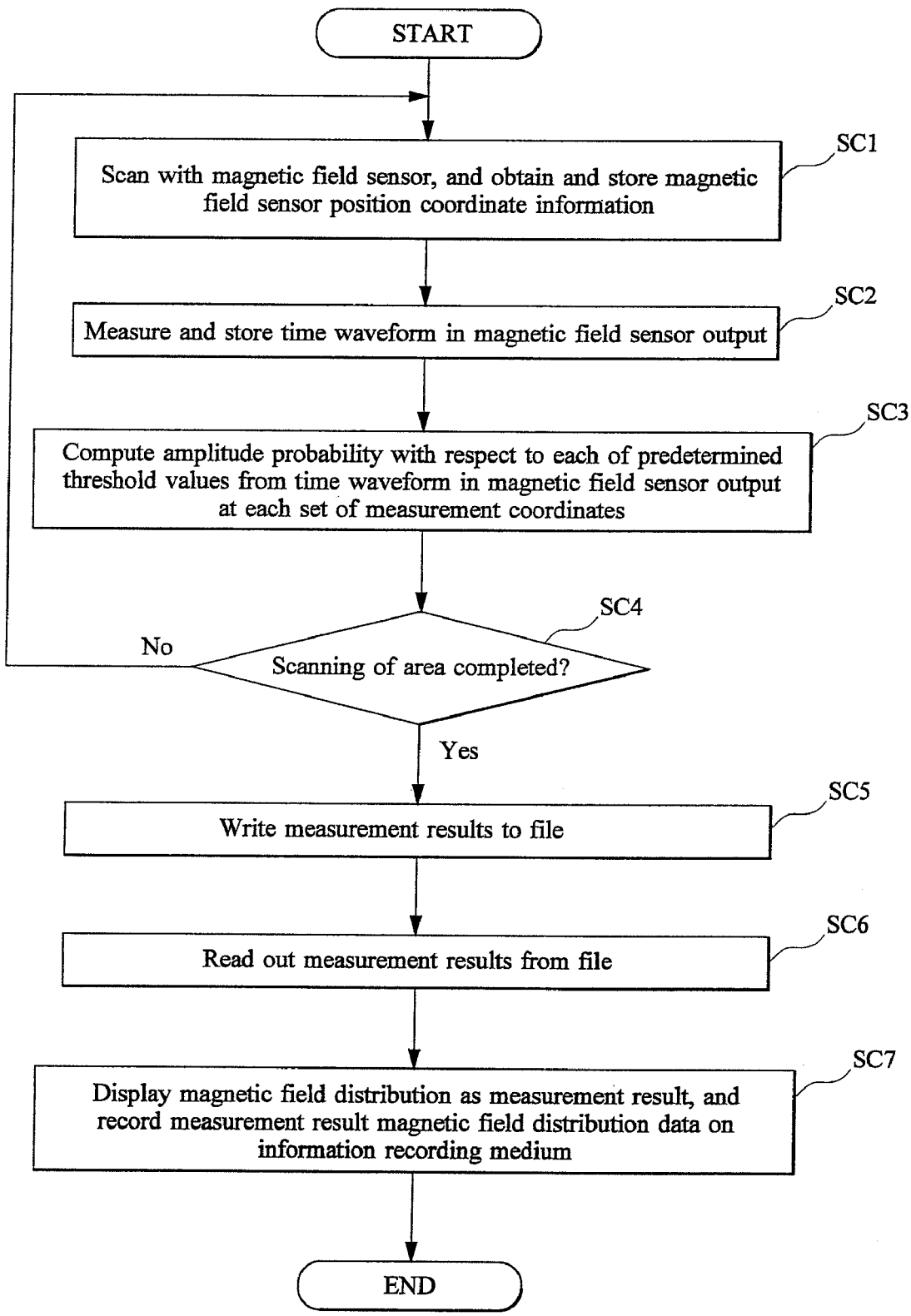
FIG. 19 is a flowchart for explaining magnetic field distribution measuring method in the third embodiment of the present invention.

The operation of the electromagnetic field distribution apparatus in this embodiment will next be described with reference to a flowchart shown in FIG. 19. FIG. 19 is a flowchart for explaining programmed processing in the computer unit 11.

When measurement is started, the scanning device control section 14 performs scanning with the magnetic field sensor 201 in a predetermined measurement plane set in the vicinity of the object 1 to be measured, obtains information on the coordinates at which the magnetic field sensor 201 is positioned, stores the information in the magnetic field information storage section 203 (SC1), inputs the intensity of a magnetic field with respect to each of sets of measurement coordinates at which measurements are to be made in the predetermined measurement plane set in the vicinity of the object 1 to be measured, and stores in the magnetic field information storage section 203 the input results for predetermined time period $T_0$ with respect to each of the sets of measurement coordinates (SC2). The results of measurement of the intensity of the magnetic field including variation with time are thereby stored in the magnetic field information storage section 203 with respect to each of the sets of measurement coordinates at which measurements have been made.

Subsequently, the magnetic field distribution information computation section 205 computes an amplitude probability of the magnetic field strength with respect to each set of measurement coordinates on the basis of the measurement results stored in the magnetic field information storage section 203 by using one or more predetermined threshold values with which measurements are to be made, and stores as an electromagnetic field distribution the distribution of amplitude probability over all the measurement coordinates with respect to each threshold value (SC3).

The computer unit 11 then determines whether or not scanning of the desired area has been completed, that is, measurements at all the coordinates at which measurements are to be made have been completed (SC4). In the case of incompletion, the computer unit 11 moves the process to the above-described processing in SC1. In the case of completion, the computer unit 11 writes to a file the information on the results of measurement of the magnetic field distribution stored in the magnetic field distribution information computation section 205 (SC5). Thereafter, the magnetic field distribution display section 206 reads out this file (SC6) and displays the magnetic field distribution measurement results. Simultaneously, the electromagnetic field distribution data recording section 17 records on an information recording medium the data on the magnetic field distribution measurement results (SC7). At the time of display of the magnetic field distribution measurement results, the threshold value for the amplitude probability can be designated and displayed. Also, an amplitude probability may be designated to display the distribution of the magnetic field strength corresponding to the designated amplitude probability.

Thus, in the case of measurement in a vicinal magnetic field in which the magnetic field intensity fluctuates, a signal is detected during the predetermined time period $T_0$ at each of a plurality of sets of measurement coordinates in a predetermined measurement plane in a space in the vicinity of the object 1 to be measured; the intensity of the magnetic field at each set of measurement coordinates is computed for the predetermined time period $T_0$; and the magnetic field distribution in the measurement plane at each set of measurement coordinates including variation with time during the predetermined time period $T_0$ is computed on the basis of the computed intensity. Thus, the magnetic field distribution can be measured while considering variation with time and reducing the influence of noise floor (thermal noise).

Further, even in the case of measurement of the influence on the receiving sensitivity of a digital communication device according to this embodiment, the magnetic field distribution is measured by considering variation with time as well as factors for the measured intensity of the magnetic field and, therefore, the relationship between mapping of the magnetic field distribution and the receiving sensitivity can be made definite.

In the above-described embodiment, the amplitude probability distribution of the magnetic field strength is grasped as a magnetic field distribution while considering variation with time. However, the average of the magnetic field intensity during the measurement time period $T_0$ may be measured with respect to each set of measurement coordinates, and the distribution over all the measurement coordinates may be measured also as a magnetic field distribution by using the averages. Grasping of the distribution considering variation with time can also be performed in this way.

In the above-described embodiment, a virtual plane at a predetermined distance from the upper surface of the object 1 to be measured is set as a measurement plane. However, an electromagnetic field distribution may be measured by setting as a measurement plane surfaces surrounding the object 1 to be measured, e.g., the six surfaces of a rectangular block surrounding the object 1 to be measured, and the measurement results may be mapped and displayed.

Electromagnetic field distribution data on each of electronic components such as ICs and composite module components probable to generate noise in a plurality of circuit blocks constituting an electronic device as described above may be obtained with respect to its single state and mapped by being divided into a plurality of areas in matrix form. The data may be stored or recorded on an information recording medium and provided to a user by attaching the information recording medium to the measured electronic component. Also, the electromagnetic field distribution data on the electronic component may be stored on an RF tag having a well-known nonvolatile memory, and the RF tag may be, for example, attached or mounted on or embedded in the electronic component.

Thus, the above-described electromagnetic field distribution measurement is performed on an electronic component in a single state such as an IC or a composite module component provided as the object 1 to be measured, and an information recording medium on which electromagnetic field distribution data obtained as measurement results are stored or recorded is provided to a user together with the electronic component treated as the measured object 1, thereby enabling the user to know from which portion of the electronic component electromagnetic waves most probable to become noise are generated, and to design an electronic circuit or an electronic device using the electronic component by considering the knowledge.

The above-described electromagnetic field distribution measuring apparatus can be easily configured by preparing an information recording medium on which the above-described computer program is recorded and by using a general-purpose computer unit.

A fourth embodiment of the present invention will be described.

Figure 20:
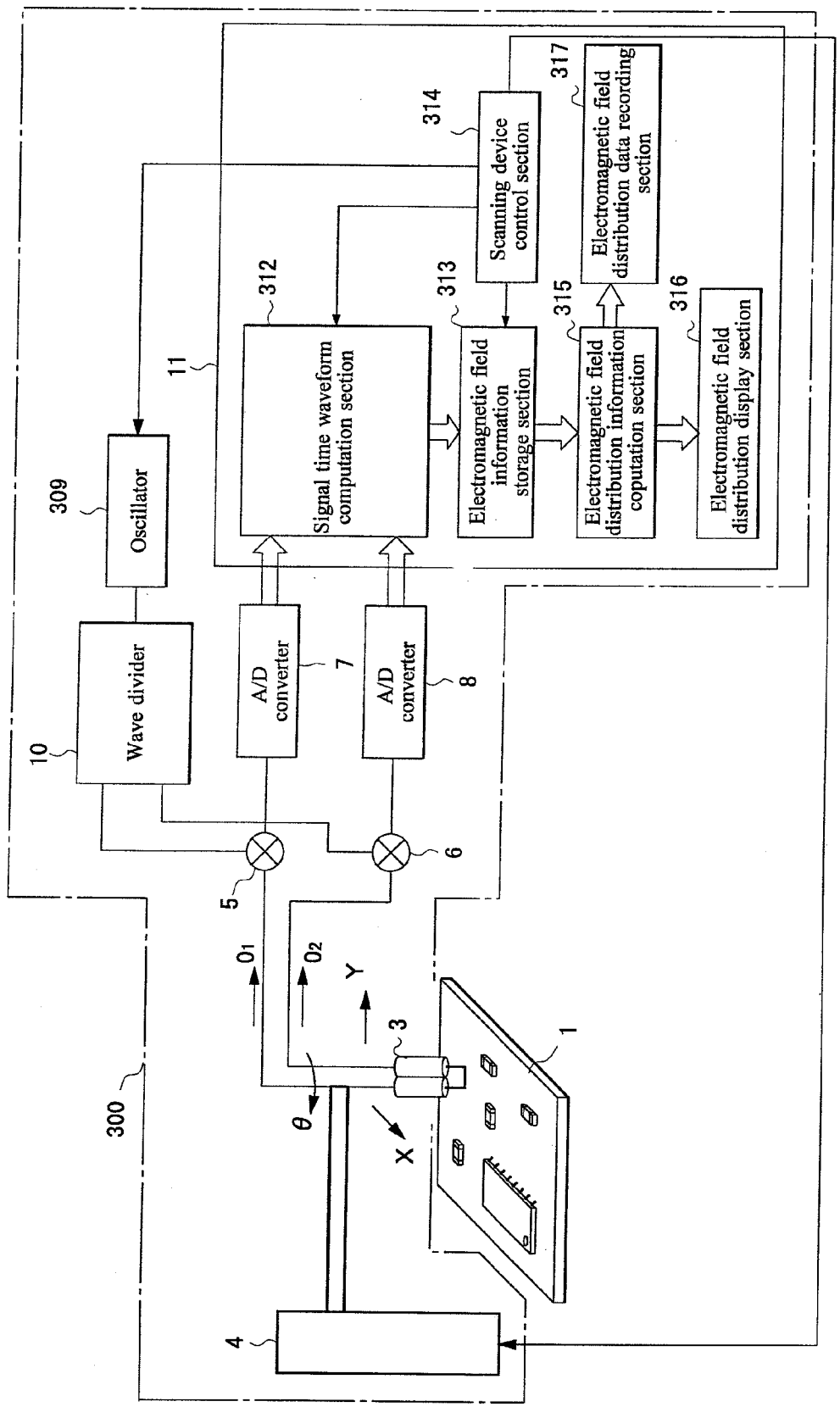
FIG. 20 is a configurational diagram showing an electromagnetic field distribution measuring apparatus in a fourth embodiment of the present invention.

FIG. 20 is a configurational diagram showing an electromagnetic field distribution measuring apparatus in the fourth embodiment of the present invention. In FIG. 20, the same components as those of the first embodiment described above are indicated by the same reference numerals. The difference between the above-described first embodiment and the fourth embodiment resides in that in the fourth embodiment is constructed an electromagnetic distribution measuring apparatus 300 which, at the time of measurement of the distribution of an electromagnetic field radiated from an object 1 to be measured at a plurality of sets of measurement coordinates in the vicinity of the object 1 to be measured, measures changes in electromagnetic field intensity in each of a plurality of frequency channels by scanning the frequency channels at each set of measurement coordinates, and which thus measures changes in electromagnetic field strength relating to changes in frequency.

The electromagnetic field distribution measuring apparatus 300 is constituted by a scanning electromagnetic field sensor (probe) 3, a sensor scanning device 4, mixers 5 and 6, analog/digital (hereinafter referred to as A/D) converters 7 and 8, an oscillator 309, a wave divider 10 and a computer unit 11.

The computer unit 11 has a signal time waveform computation section 312, an electromagnetic field information storage section 313, a scanning device control section 314, an electromagnetic field distribution information computation section 315, an electromagnetic field distribution display section 316 and an electromagnetic field distribution data recording section 317.

The electromagnetic field distribution measuring apparatus 300 measures the distribution of the intensity of a vicinal electromagnetic field in a virtual plane at a predetermined distance from an upper surface of the object 1 to be measured. During intensity distribution measurement, the object 1 to be measured is in an operating state and the distribution of the intensity of the electromagnetic field formed by electromagnetic waves in each of a plurality of frequency channels radiated during the operation of the object 1 to be measured is measured by the electromagnetic field distribution measuring apparatus 300. In this embodiment, the above-mentioned frequency channel is assumed to be a frequency band of a predetermined frequency bandwidth about a predetermined frequency (e.g., a ±0.1 MHz bandwidth).

To each of the mixers 5 and 6, a reference signal for frequency conversion generated by the oscillator 309 is input via the wave divider 10. Output terminals of the mixers 5 and 6 are connected to the A/D converters 7 and 8. The input signals to the A/D converters 7 and 8 are down-converted into digital data. The data converted by the A/D converters 7 and 8 is input to the signal time waveform computation section 312 of the computer unit 11. The oscillation frequency of the oscillator 309 is controlled by the scanning device control section 314 to enable measurement of the electromagnetic field distribution in the plurality of frequency channels with respect to each of sets of measurement coordinates.

The signal time waveform computation section 312 and the electromagnetic field information storage section 313 operate on the basis of control signals from the scanning device control section 314 to compute the intensity and direction of an electric field and the intensity and direction of a magnetic field in each of the plurality of frequency channels in a predetermined measurement plane set in the vicinity of the object 1 to be measured with respect to each of sets of measurement coordinates at which measurements are to be made, and to store the computation results for predetermined time period $T_0$ in correspondence with the sets of measurement coordinates. The results of measurement of the intensity and direction of the electric field and the intensity and direction of the magnetic field including variation with time are thereby stored in the electromagnetic field information storage section 313 with respect to each of the frequency channels at each of the sets of measurement coordinates at which measurements have been made.

The scanning device control section 314 controls drive of the sensor scanning device 4 so that the predetermined measurement plane set in the vicinity of the object 1 to be measured is scanned with the loop antenna 31. The scanning device control section 314 also changes the oscillation frequency of the oscillator 309 at intervals of the predetermined time period $T_0$ at each set of measurement coordinates to enable measurement in each of the above-mentioned plurality of frequency channels.

Figure 21:
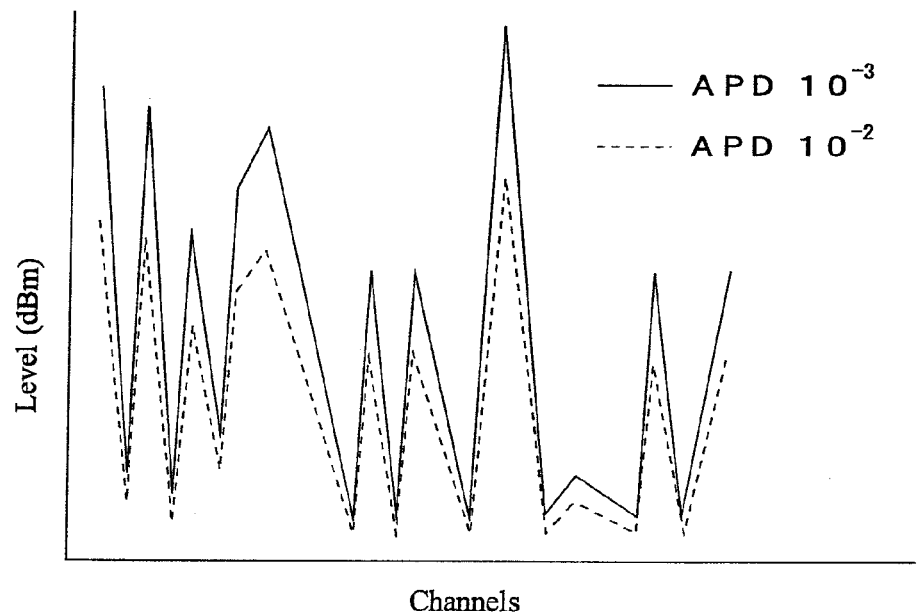
FIG. 21 is a graph showing an electromagnetic field distribution at predetermined measurement coordinates, with the abscissa representing channels (frequencies) and the ordinate representing the equal-probability level value.
Figure 22:
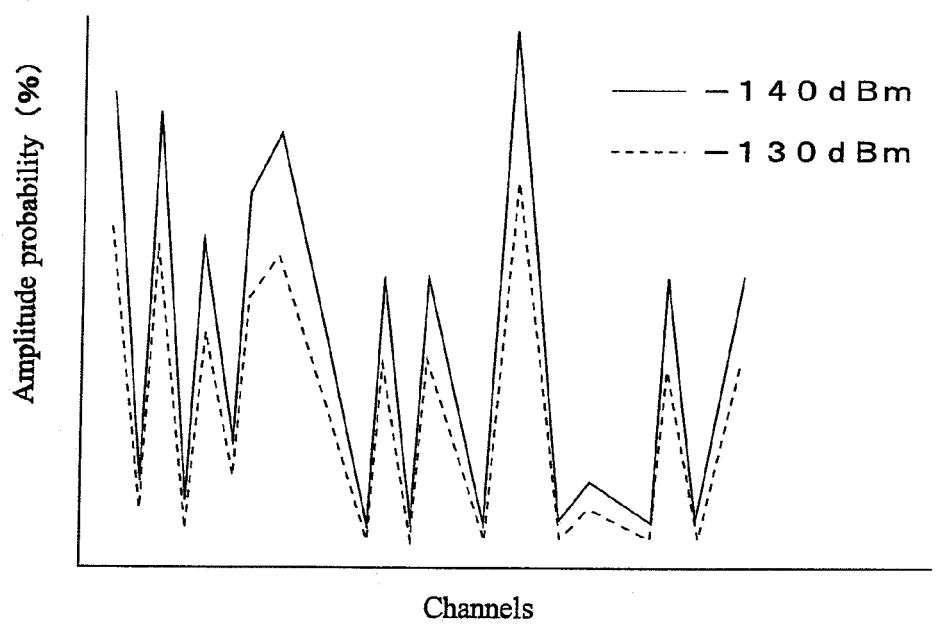
FIG. 22 is a graph showing an electromagnetic field distribution at predetermined measurement coordinates, with the abscissa representing channels (frequencies) and the ordinate representing the equal-level amplitude probability value.

The electromagnetic field distribution information computation section 315 computes an amplitude probability of each of the electric field strength and the magnetic field strength in each of the plurality of frequency channels with respect to each set of measurement coordinates by using predetermined threshold values on the basis of the measurement results stored in the electromagnetic field information storage section 313, and stores as an electromagnetic field distribution the distribution of amplitude probability over all the frequency channels at all the measurement coordinates with respect to each threshold value. The electromagnetic field distribution computed in this embodiment is represented by data with respect to each frequency channel at each set of measurement coordinates with the abscissa representing time and the ordinate representing the amplitude probability value as well as by data with respect to each set of measurement coordinates with the abscissa representing the frequency channels (frequencies) and the ordinate representing the level or amplitude probability value as shown in FIGS. 21 and 22. FIG. 21 is a graph showing the electromagnetic field distribution at predetermined measurement coordinates with the abscissa representing the frequency channels (frequencies) and the ordinate representing the equal-probability level value. FIG. 22 is a graph showing the electromagnetic field distribution at the predetermined measurement coordinates with the abscissa representing the frequency channels (frequencies) and the ordinate representing the equal-level amplitude probability value.

Figure 23:
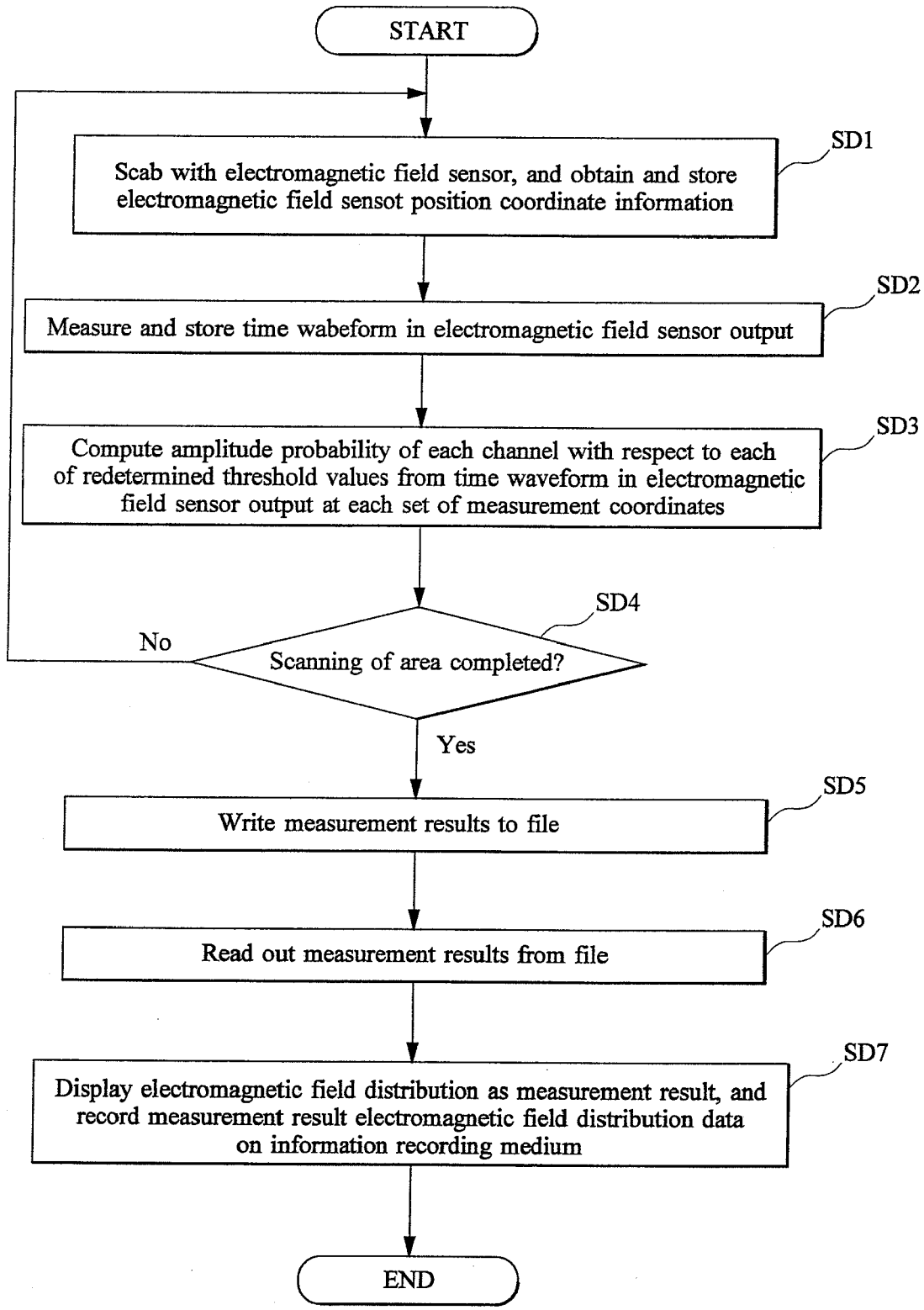
FIG. 23 is a flowchart for explaining magnetic field distribution measuring method in the fourth embodiment of the present invention.

The operation of the electromagnetic field distribution apparatus in this embodiment will next be described with reference to a flowchart shown in FIG. 23. FIG. 23 is a flowchart for explaining programmed processing in the computer unit 11.

When measurement is started, the scanning device control section 314 performs scanning with the electromagnetic field sensor 3 in a predetermined measurement plane set in the vicinity of the object 1 to be measured, obtains information on the coordinates at which the electromagnetic field sensor 3 is positioned, stores the information in the electromagnetic field information storage section 313 (SD1), computes, by means of the signal time waveform computation section 312, the intensity and direction of an electric field and the intensity and direction of a magnetic field with respect to each of sets of measurement coordinates at which measurements are to be made in the predetermined measurement plane set in the vicinity of the object 1 to be measured, and stores in the electromagnetic field information storage section 313 the computation results for predetermined time period $T_0$ with respect to each of the sets of measurement coordinates (SD2). The results of measurement of the intensity and direction of the electric field and the intensity and direction of the magnetic field including variation with time are thereby stored in the electromagnetic field information storage section 313 with respect to each of the sets of measurement coordinates at which measurements have been made, and with respect to each frequency channel.

Subsequently, the electromagnetic field distribution information computation section 315 computes an amplitude probability of each of the electric field strength and the magnetic field strength in each frequency channel with respect to each set of measurement coordinates on the basis of the measurement results stored in the electromagnetic field information storage section 313 by using one or more predetermined threshold values with which measurements are to be made, and stores as an electromagnetic field distribution the distribution of amplitude probability over the plurality of frequency channels (plurality of frequencies) at all the measurement coordinates with respect to each threshold value (SD3). In this embodiment, the distribution of amplitude probability of each of the electric field strength and the magnetic field strength is stored as an electromagnetic field distribution, and each of the distributions of the electric field strength and the magnetic field strength can be selectively displayed at the time of display of the measurement results.

The computer unit 11 then determines whether or not scanning of the desired area has been completed, that is, measurements at all the coordinates at which measurements are to be made and through the frequency channels in which measurements are to be made have been completed (SD4). In the case of incompletion, the computer unit 11 moves the process to the above-described processing in SD1. In the case of completion, the computer unit 11 writes to a file the information on the results of measurement of the electromagnetic field distribution stored in the electromagnetic field distribution information computation section 315 (SD5). Thereafter, the electromagnetic field distribution display section 316 reads out this file (SD6) and displays the electromagnetic field distribution measurement results. Simultaneously, the electromagnetic field distribution data recording section 317 records on an information recording medium the data on the electromagnetic field distribution measurement results (SD7). At the time of display of the electromagnetic field distribution measurement results, the frequency channel and the threshold values for the amplitude probability can be designated and displayed. Also, an amplitude probability may be designated to display the distribution of the electromagnetic field strength corresponding to the designated amplitude probability.

Thus, in the case of measurement in a vicinal electromagnetic field in which the electromagnetic field intensity fluctuates, a signal is detected during the predetermined time period $T_0$ in each frequency channel at each of a plurality of sets of measurement coordinates in a predetermined measurement plane in a space in the vicinity of the object 1 to be measured; the intensity of the electric field in each frequency channel at each set of measurement coordinates is computed for the predetermined time period $T_0$; and the electric field distribution in the measurement plane in each frequency channel at each set of measurement coordinates including variation with time during the predetermined time period $T_0$ is computed on the basis of the computed intensity. Thus, the electromagnetic field distribution can be measured while considering variation with time and changes in frequency and reducing the influence of noise floor (thermal noise).

Further, even in the case of measurement of the influence on the receiving sensitivity of a digital communication device according to this embodiment, the electromagnetic field distribution is measured by considering variation with time and changes in frequency as well as factors for the measured intensity of the electromagnetic field and, therefore, the relationship between mapping of the electromagnetic field distribution and the receiving sensitivity can be made definite.

In the above-described embodiment, the amplitude probability distribution of the electromagnetic field strength is grasped as an electromagnetic field distribution while considering variation with time and changes in frequency. However, the average of the electromagnetic field intensity during the measurement time period $T_0$ may be measured with respect to each set of measurement coordinates and each frequency channel, and the distribution over all the measurement coordinates and all the frequency channels may be measured also as an electric field distribution by using the averages. Grasping of the distribution considering variation with time and changes in frequency can also be performed in this way.

In the above-described embodiment, a virtual plane at a predetermined distance from the upper surface of the object 1 to be measured is set as a measurement plane. However, an electromagnetic field distribution may be measured by setting as a measurement plane surfaces surrounding the object 1 to be measured, e.g., the six surfaces of a rectangular block surrounding the object 1 to be measured, and the measurement results may be mapped and displayed.

Electromagnetic field distribution data on each of electronic components such as ICs and composite module components probable to generate noise in a plurality of circuit blocks constituting an electronic device as described above may be obtained with respect to its single state and mapped by being divided into a plurality of areas in matrix form. The data may be stored or recorded on an information recording medium and provided to a user by attaching the information recording medium to the measured electronic component. Also, the electromagnetic field distribution data on the electronic component may be stored on an RF tag having a well-known nonvolatile memory, and the RF tag may be, for example, attached or mounted on or embedded in the electronic component.

Thus, the above-described electromagnetic field distribution measurement is performed on an electronic component in a single state such as an IC or a composite module component provided as the object 1 to be measured, and an information recording medium on which electromagnetic field distribution data obtained as measurement results are stored or recorded is provided to a user together with the electronic component treated as the measured object 1, thereby enabling the user to know from which portion of the electronic component electromagnetic waves most probable to become noise are generated, and to design an electronic circuit or an electronic device using the electronic component by considering the knowledge.

The above-described electromagnetic field distribution measuring apparatus can be easily configured by preparing an information recording medium on which the above-described computer program is recorded and by using a general-purpose computer unit.

A fifth embodiment of the present invention will be described.

Figure 24:
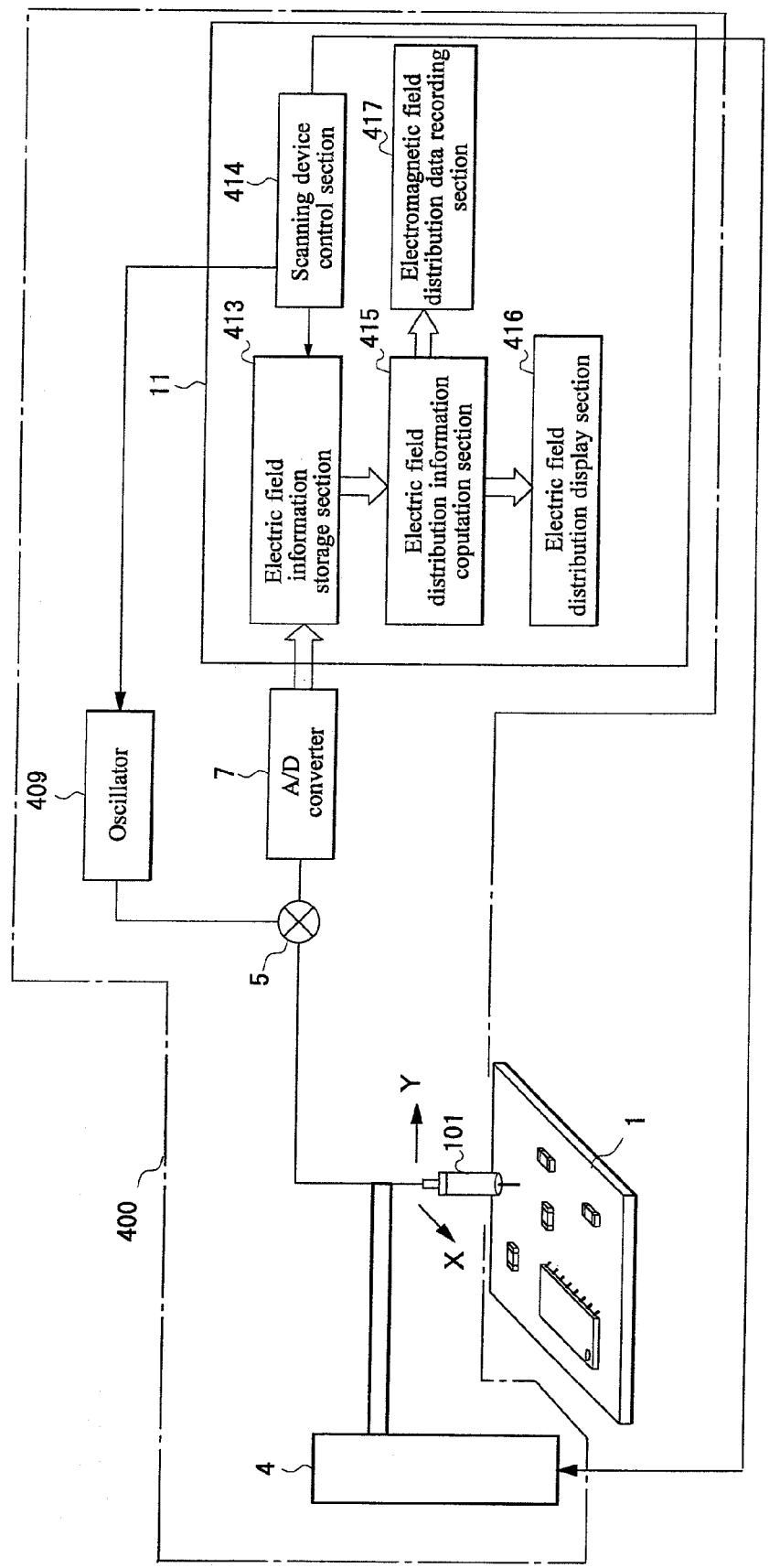
FIG. 24 is a configurational diagram showing an electromagnetic field distribution measuring apparatus in a fifth embodiment of the present invention.

FIG. 24 is a configurational diagram showing an electromagnetic field distribution measuring apparatus in the fifth embodiment of the present invention. In FIG. 24, the same components as those of the first and second embodiments described above are indicated by the same reference numerals. The difference between the above-described first and second embodiments and the fifth embodiment resides in that in the fifth embodiment is constructed an electromagnetic field distribution measuring apparatus 400 which, at the time of measurement of the distribution of an electric field radiated from an object 1 to be measured at a plurality of sets of measurement coordinates in the vicinity of the object 1 to be measured, measures changes in electromagnetic field intensity in each of a plurality of frequency channels by scanning the frequency channels at each set of measurement coordinates, and which thus measures changes in electric field strength relating to changes in frequency.

The electromagnetic field distribution measuring apparatus 400 is constituted by a scanning electric field sensor (probe) 101, a sensor scanning device 4, a mixer 5, an A/D converter 7, an oscillator 409 and a computer unit 11.

The computer unit 11 has an electric field information storage section 413, a scanning device control section 414, an electric field distribution information computation section 415, an electric field distribution display section 416 and an electromagnetic field distribution data recording section 417.

The electromagnetic field distribution measuring apparatus 400 measures the distribution of the intensity of an electric field in the vicinity of the object 1 to be measured. During intensity distribution measurement, the object 1 to be measured is in an operating state and the distribution of the intensity of the electric field formed by electromagnetic waves in a predetermined frequency channel radiated during the operation of the object 1 to be measured is measured by the electromagnetic field distribution measuring apparatus 400. In this embodiment, the above-mentioned frequency channel is assumed to be a frequency band of a predetermined frequency bandwidth about a predetermined frequency (e.g., a ±0.1 MHz bandwidth).

The scanning electric field sensor 101 is similar to that shown in FIG. 14. A reference signal for frequency conversion generated by the oscillator 409 is input to the mixer 5. An output terminal of the mixer 5 is connected to the A/D converter 7. The input signal to the A/D converter 7 is down-converted into digital data. The data converted by the A/D converter 7 is input to the electric field information storage section 413 of the computer unit 11.

The electric field information storage section 413 operates on the basis of a control signal from the scanning device control section 414 to be supplied with the intensity of an electric field in each of frequency channels in a predetermined measurement plane set in the vicinity of the object 1 to be measured with respect to each of sets of measurement coordinates at which measurements are to be made, and to store the input results for predetermined time $T_0$ in correspondence with the sets of measurement coordinates with respect to each frequency channel. The results of measurement of the intensity of the electric field including variation with time and changes in frequency are thereby stored in the electric field information storage section 413 with respect to each of the frequency channels at each of the sets of measurement coordinates at which measurements have been made.

The scanning device control section 414 controls drive of the sensor scanning device 4 so that the predetermined measurement plane set in the vicinity of the object 1 to be measured is scanned with the monopole antenna 101. The scanning device control section 414 also changes the oscillation frequency of the oscillator 409 at intervals of the predetermined time period $T_0$ at each set of measurement coordinates to enable measurement in each of the above-mentioned plurality of frequency channels.

The electric field distribution information computation section 415 computes an amplitude probability $D(E_k)$ of the electric field strength in each of the plurality of frequency channels with respect to each set of measurement coordinates by using predetermined threshold values on the basis of the measurement results stored in the electric field information storage section 413, and stores as an electric field distribution the distribution of amplitude probability $D(E_k)$ over all the frequency channels at all the measurement coordinates with respect to each threshold value. The method of computing the amplitude probability $D(E_k)$ is the same as that of the first embodiment described above. The electric field distribution computed in this embodiment is represented by data with respect to each frequency channel at each set of measurement coordinates with the abscissa representing time and the ordinate representing the amplitude probability value as well as by data with respect to each set of measurement coordinates with the abscissa representing the frequency channels (frequencies) and the ordinate representing the level or amplitude probability value as shown in FIGS. 21 and 22.

The electric field distribution display section 416 maps and displays the electric field distribution stored in the electric field distribution information computation section 415.

The electromagnetic field distribution data recording section 417 records on an easily portable computer-readable information recording medium such as a compact disk (CD), a DVD or a flexible magnetic disk the data on the electric field distribution information stored in the electric field distribution information computation section 415.

Figure 25:
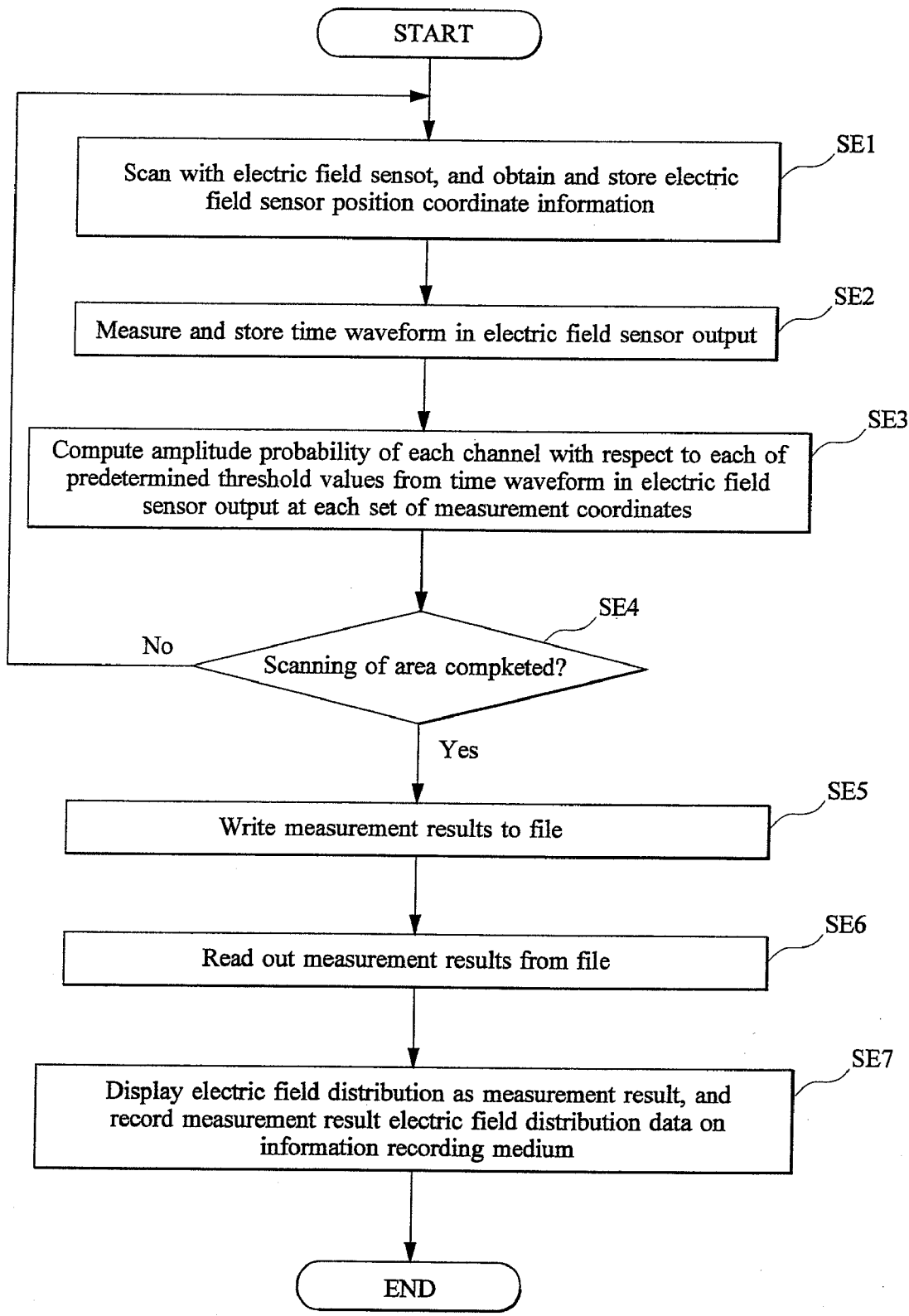
FIG. 25 is a flowchart for explaining magnetic field distribution measuring method in the fifth embodiment of the present invention.

The operation of the electromagnetic field distribution apparatus in this embodiment will next be described with reference to a flowchart shown in FIG. 25. FIG. 25 is a flowchart for explaining programmed processing in the computer unit 11.

When measurement is started, the scanning device control section 414 performs scanning with the electric field sensor 101 in a predetermined measurement plane set in the vicinity of the object 1 to be measured, obtains information on the coordinates at which the electric field sensor 101 is positioned, stores the information in the electric field information storage section 413 (SE1), inputs the intensity of an electric field with respect to each of sets of measurement coordinates at which measurements are to be made in the predetermined measurement plane set in the vicinity of the object 1 to be measured, and stores in the electric field information storage device 413 the input results for predetermined time period $T_0$ with respect to each of the sets of measurement coordinates (SE2). The results of measurement of the intensity of the electric field including variation with time are thereby stored in the electric field information storage section 413 with respect to each of the sets of measurement coordinates at which measurements have been made and with respect to each frequency channel.

Subsequently, the electric field distribution information computation section 415 computes an amplitude probability of the electric field strength in each frequency channel with respect to each set of measurement coordinates on the basis of the measurement results stored in the electric field information storage section 413 by using one or more predetermined threshold values with which measurements are to be made, and stores as an electromagnetic field distribution the distribution of amplitude probability over the plurality of frequency channels (a plurality of frequencies) at all the measurement coordinates with respect to each threshold value (SE3).

The computer unit 11 then determines whether or not scanning of the desired area has been completed, that is, measurements at all the coordinates at which measurements are to be made have been completed (SE4). In the case of incompletion, the computer unit 11 moves the process to the above-described processing in SE1. In the case of completion, the computer unit 11 writes to a file the information on the results of measurement of the electric field distribution stored in the electric field distribution information computation section 105 (SE5). Thereafter, the electric field distribution display section 416 reads out this file (SE6) and displays the electric field distribution measurement results. Simultaneously, the electromagnetic field distribution data recording section 417 records on an information recording medium the data on the electric field distribution measurement results (SE7). At the time of display of the electric field distribution measurement results, the frequency channel and the threshold value for the amplitude probability can be designated and displayed. Also, an amplitude probability may be designated to display the distribution of the electric field strength corresponding to the designated amplitude probability.

Thus, in the case of measurement in a vicinal electric field in which the electric field intensity fluctuates, a signal is detected during the predetermined time period $T_0$ in each frequency channel at each of a plurality of sets of measurement coordinates in a predetermined measurement plane in a space in the vicinity of the object 1 to be measured; the intensity of the electric field in each frequency channel at each set of measurement coordinates is computed for the predetermined time period $T_0$; and the electric field distribution in the measurement plane in each frequency channel at each set of measurement coordinates including variation with time during the predetermined time period $T_0$ is computed on the basis of the computed intensity. Thus, the electric field distribution can be measured while considering variation with time and changes in frequency and reducing the influence of noise floor (thermal noise).

Further, even in the case of measurement of the influence on the receiving sensitivity of a digital communication device according to this embodiment, the electric field distribution is measured by considering variation with time and changes in frequency as well as factors for the measured intensity of the electric field and, therefore, the relationship between mapping of the electric field distribution and the receiving sensitivity can be made definite.

In the above-described embodiment, the amplitude probability distribution of the electric field strength is grasped as an electric field distribution while considering variation with time and changes in frequency. However, the average of the electric field intensity during the measurement time period $T_0$ may be measured with respect to each set of measurement coordinates and each frequency channel, and the distribution over all the measurement coordinates and all the frequency channels may be measured as an electric field distribution by using the averages. Grasping of the distribution considering variation with time and changes in frequency can also be performed in this way.

In the above-described embodiment, a virtual plane at a predetermined distance from the upper surface of the object 1 to be measured is set as a measurement plane. However, an electromagnetic field distribution may be measured by setting as a measurement plane surfaces surrounding the object 1 to be measured, e.g., the six surfaces of a rectangular block surrounding the object 1 to be measured, and the measurement results may be mapped and displayed.

Electromagnetic field distribution data on each of electronic components such as ICs and composite module components probable to generate noise in a plurality of circuit blocks constituting an electronic device as described above may be obtained with respect to its single state and mapped by being divided into a plurality of areas in matrix form. The data may be stored or recorded on an information recording medium and provided to a user by attaching the information recording medium to the measured electronic component. Also, the electromagnetic field distribution data on the electronic component may be stored on an RF tag having a well-known nonvolatile memory, and the RF tag may be, for example, attached or mounted on or embedded in the electronic component.

Thus, the above-described electromagnetic field distribution measurement is performed on an electronic component in a single state such as an IC or a composite module component provided as the object 1 to be measured, and an information recording medium on which electromagnetic field distribution data obtained as measurement results are stored or recorded is provided to a user together with the electronic component treated as the measured object 1, thereby enabling the user to know from which portion of the electronic component electromagnetic waves most probable to become noise are generated, and to design an electronic circuit or an electronic device using the electronic component by considering the knowledge.

The above-described electromagnetic field distribution measuring apparatus can be easily configured by preparing an information recording medium on which the above-described computer program is recorded and by using a general-purpose computer unit.

A sixth embodiment of the present invention will be described.

Figure 26:
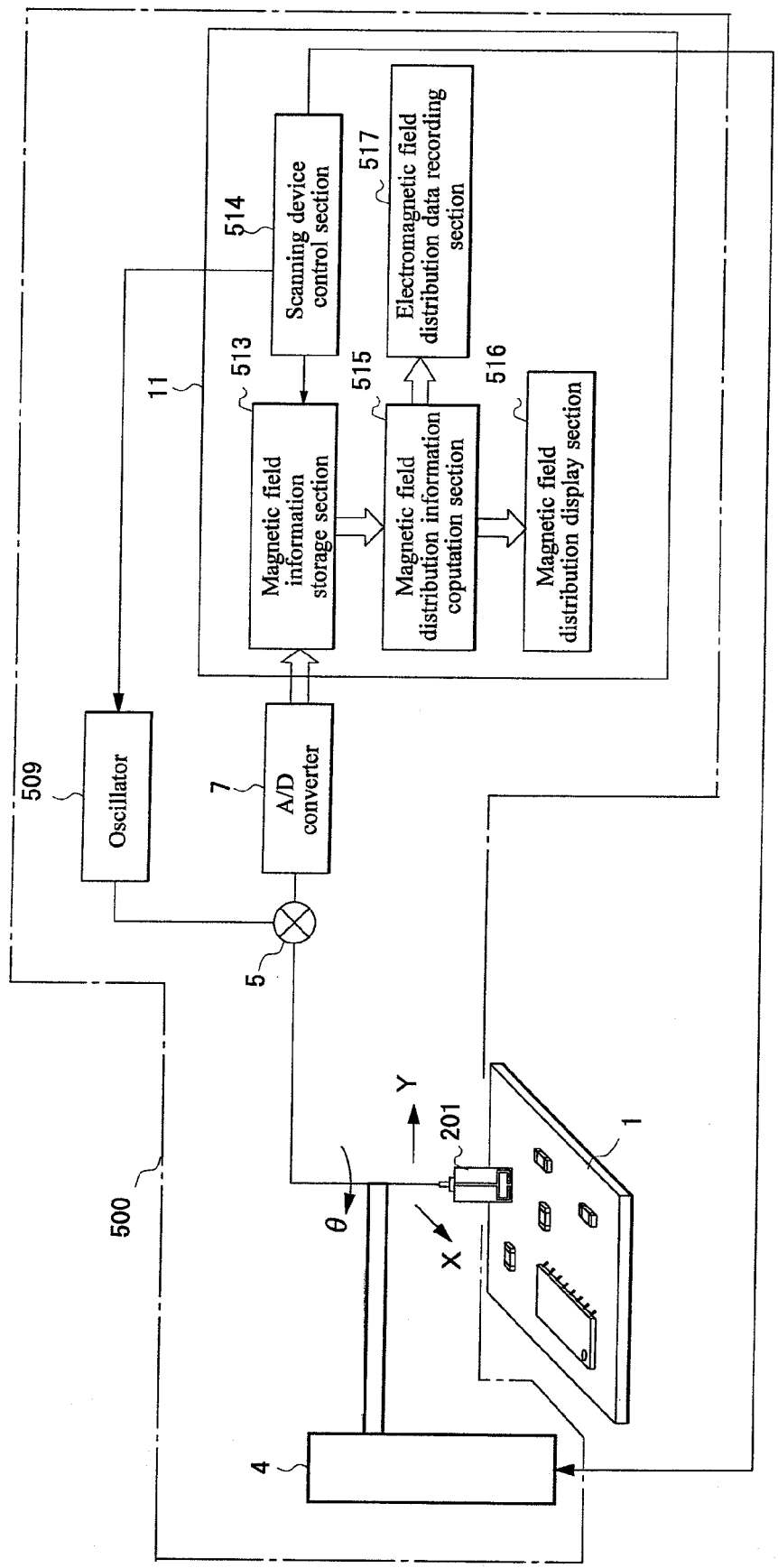
FIG. 26 is a configurational diagram showing an electromagnetic field distribution measuring apparatus in a sixth embodiment of the present invention.

FIG. 26 is a configurational diagram showing an electromagnetic field distribution measuring apparatus in the sixth embodiment of the present invention. In FIG. 26, the same components as those of the first and third embodiments described above are indicated by the same reference numerals. The difference between the above-described first and third embodiments and the sixth embodiment resides in that in the sixth embodiment is constructed an electromagnetic field distribution measuring apparatus 500 which, at the time of measurement of the distribution of a magnetic field radiated from an object 1 to be measured at a plurality of sets of measurement coordinates in the vicinity of the object 1 to be measured, measures changes in magnetic field intensity in each of a plurality of frequency channels by scanning the frequency channels at each set of measurement coordinates, and which thus measures changes in magnetic field strength relating to changes in frequency.

The electromagnetic field distribution measuring apparatus 500 is constituted by a scanning magnetic field sensor (probe) 201, a sensor scanning device 4, a mixer 5, an A/D converter 7, an oscillator 509 and a computer unit 11.

The computer unit 11 has a magnetic field information storage section 513, a scanning device control section 514, a magnetic field distribution information computation section 515, a magnetic field distribution display section 516 and an electromagnetic field distribution data recording section 517.

The electromagnetic field distribution measuring apparatus 500 measures the distribution of the intensity of a magnetic field in the vicinity of the object 1 to be measured. During intensity distribution measurement, the object 1 to be measured is in an operating state and the distribution of the intensity of the magnetic field formed by electromagnetic waves in a predetermined frequency channel radiated during the operation of the object 1 to be measured is measured by the electromagnetic field distribution measuring apparatus 200. In this embodiment, the above-mentioned frequency channel is assumed to be a frequency band of a predetermined frequency bandwidth about a predetermined frequency (e.g., a ±0.1 MHz bandwidth).

The scanning magnetic field sensor 201 is similar to that shown in FIG. 17 or 18. A reference signal for frequency conversion generated by the oscillator 9 is input to the mixer 5. An output terminal of the mixer 5 is connected to the A/D converter 7. The input signal to the A/D converter 7 is down-converted into digital data. The data converted by the A/D converter 7 is input to the magnetic field information storage section 513 of the computer unit 11.

The magnetic field information storage section 513 operates on the basis of a control signal from the scanning device control section 514 to be supplied with the intensity of a magnetic field in each of frequency channels in a predetermined measurement plane set in the vicinity of the object 1 to be measured with respect to each of sets of measurement coordinates at which measurements are to be made, and to store the input results for predetermined time period $T_0$ in correspondence with the sets of measurement coordinates with respect to each frequency channel. The results of measurement of the intensity of the magnetic field including variation with time and changes in frequency are thereby stored in the magnetic field information storage section 513 with respect to each of the frequency channels at each of the sets of measurement coordinates at which measurements have been made.

The scanning device control section 514 controls drive of the sensor scanning device 4 so that the predetermined measurement plane set in the vicinity of the object 1 to be measured is scanned with the monopole antenna 201. The scanning device control section 514 also changes the oscillation frequency of the oscillator 509 at intervals of the predetermined time period $T_0$ at each set of measurement coordinates to enable measurement in each of the above-mentioned plurality of frequency channels.

The magnetic field distribution information computation section 515 computes an amplitude probability $D(E_k)$ of the magnetic field strength with respect to each set of measurement coordinates by using predetermined threshold values on the basis of the measurement results stored in the magnetic field information storage section 513, and stores as a magnetic field distribution the distribution of amplitude probability $D(E_k)$ over all the measurement coordinates with respect to each threshold value. The method of computing the amplitude probability $D(E_k)$ is the same as that in the first embodiment described above. The magnetic field distribution computed in this embodiment is represented by data with respect to each frequency channel at each set of measurement coordinates with the abscissa representing time and the ordinate representing the amplitude probability value as well as by data with respect to each set of measurement coordinates with the abscissa representing the frequency channels (frequencies) and the ordinate representing the level or amplitude probability value as shown in FIGS. 21 and 22.

The magnetic field distribution display section 516 maps and displays the magnetic field distribution stored in the magnetic field distribution information computation section 515.

The electromagnetic field distribution data recording section 517 records on an easily portable computer-readable information recording medium such as a compact disk (CD), a DVD or a flexible magnetic disk the data on the magnetic field distribution information stored in the magnetic field distribution information computation section 515.

Figure 27:
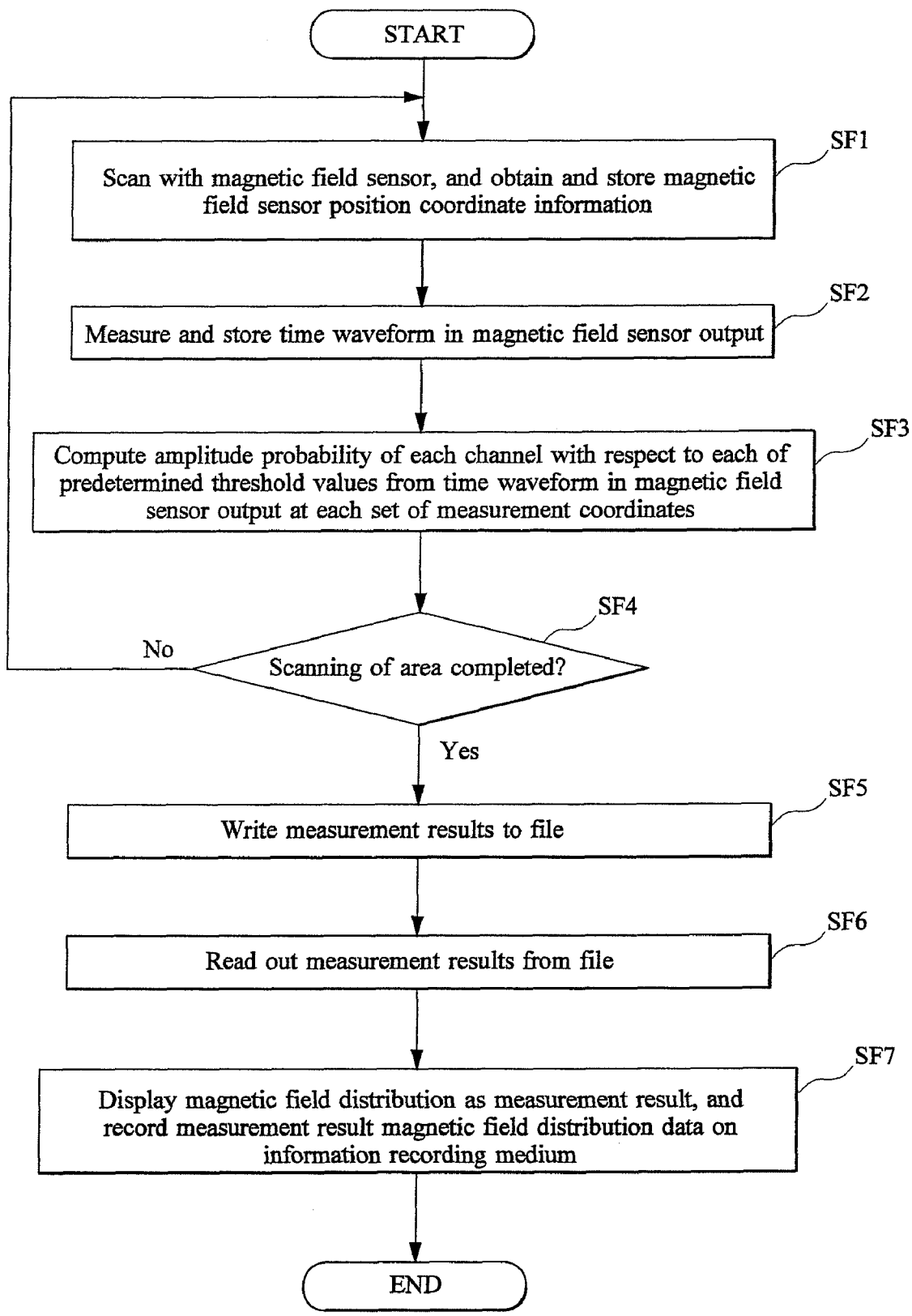
FIG. 27 is a flowchart for explaining magnetic field distribution measuring method in the sixth embodiment of the present invention.

The operation of the electromagnetic field distribution apparatus in this embodiment will next be described with reference to a flowchart shown in FIG. 27. FIG. 27 is a flowchart for explaining programmed processing in the computer unit 11.

When measurement is started, the scanning device control section 514 performs scanning with the magnetic field sensor 201 in a predetermined measurement plane set in the vicinity of the object 1 to be measured, obtains information on the coordinates at which the magnetic field sensor 201 is positioned, stores the information in the magnetic field information storage section 513 (SF1), inputs the intensity of a magnetic field with respect to each of sets of measurement coordinates at which measurements are to be made in the predetermined measurement plane set in the vicinity of the object 1 to be measured, and stores the input results for predetermined time period $T_0$ with respect to each of the sets of measurement coordinates (SF2). The results of measurement of the intensity of the magnetic field including variation with time are thereby stored in the magnetic field information storage section 513 with respect to each of the sets of measurement coordinates at which measurements have been made and with respect to each frequency channel.

Subsequently, the magnetic field distribution information computation section 515 computes an amplitude probability of the magnetic field strength in each frequency channel with respect to each set of measurement coordinates on the basis of the measurement results stored in the magnetic field information storage section 513 by using one or more predetermined threshold values with which measurements are to be made, and stores as an electromagnetic field distribution the distribution of amplitude probability over all the plurality of frequency channels (a plurality of frequencies) at all the measurement coordinates with respect to each threshold value (SF3).

The computer unit 11 then determines whether or not scanning of the desired area has been completed, that is, measurements at all the coordinates at which measurements are to be made have been completed (SF4). In the case of incompletion, the computer unit 11 moves the process to the above-described processing in SF1. In the case of completion, the computer unit 11 writes to a file the information on the results of measurement of the magnetic field distribution stored in the magnetic field distribution information computation section 205 (SF5). Thereafter, the magnetic field distribution display section 516 reads out this file (SF6) and displays the magnetic field distribution measurement results. Simultaneously, the electromagnetic field distribution data recording section 517 records on an information recording medium the data on the magnetic field distribution measurement results (SF7). At the time of display of the magnetic field distribution measurement results, the frequency channel and the threshold value for the amplitude probability can be designated and displayed. Also, an amplitude probability may be designated to display the distribution of the magnetic field strength corresponding to the designated amplitude probability.

Thus, in the case of measurement in a vicinal magnetic field in which the magnetic field intensity fluctuates, a signal is detected during the predetermined time period $T_0$ in each frequency channel at each of a plurality of sets of measurement coordinates in a predetermined measurement plane in a space in the vicinity of the object 1 to be measured; the intensity of the magnetic field in each frequency channel at each set of measurement coordinates is computed for the predetermined time period $T_0$; and the magnetic field distribution in each frequency channel in the measurement plane at each set of measurement coordinates including variation with time during the predetermined time period $T_0$ is computed on the basis of the computed intensity. Thus, the magnetic field distribution can be measured while considering variation with time and changes in frequency and reducing the influence of noise floor (thermal noise).

Further, even in the case of measurement of the influence on the receiving sensitivity of a digital communication device according to this embodiment, the magnetic field distribution is measured by considering variation with time and changes in frequency as well as factors for the measured intensity of the magnetic field and, therefore, the relationship between mapping of the magnetic field distribution and the receiving sensitivity can be made definite.

In the above-described embodiment, the amplitude probability distribution of the magnetic field strength is grasped as a magnetic field distribution while considering variation with time and changes in frequency. However, the average of the magnetic field intensity during the measurement time period $T_0$ may be measured with respect to each set of measurement coordinates and each frequency channel and the distribution over all the measurement coordinates and all the frequency channels may be measured as a magnetic field distribution by using the averages. Grasping of the distribution considering variation with time and changes in frequency can also be performed in this way.

In the above-described embodiment, a virtual plane at a predetermined distance from the upper surface of the object 1 to be measured is set as a measurement plane. However, an electromagnetic field distribution may be measured by setting as a measurement plane surfaces surrounding the object 1 to be measured, e.g., the six surfaces of a rectangular block surrounding the object 1 to be measured, and the measurement results may be mapped and displayed.

Electromagnetic field distribution data on each of electronic components such as ICs and composite module components probable to generate noise in a plurality of circuit blocks constituting an electronic device as described above may be obtained with respect to its single state and mapped by being divided into a plurality of areas in matrix form. The data may be stored or recorded on an information recording medium and provided to a user by attaching the information recording medium to the measured electronic component. Also, the electromagnetic field distribution data on the electronic component may be stored on an RF tag having a well-known nonvolatile memory, and the RF tag may be, for example, attached or mounted on or embedded in the electronic component.

Thus, the above-described electromagnetic field distribution measurement is performed on an electronic component in a single state such as an IC or a composite module component provided as the object 1 to be measured, and an information recording medium on which electromagnetic field distribution data obtained as measurement results are stored or recorded is provided to a user together with the electronic component treated as the measured object 1, thereby enabling the user to know from which portion of the electronic component electromagnetic waves most probable to become noise are generated, and to design an electronic circuit or an electronic device using the electronic component by considering the knowledge.

The above-described electromagnetic field distribution measuring apparatus can be easily configured by preparing an information recording medium on which the above-described computer program is recorded and by using a general-purpose computer unit.

In each of the above-described embodiments, the information recording medium is not limited to the medium on which electronic data is stored; it may be a medium having information recorded on paper or the like.

While the frequency channel in each of the above-described embodiments has been described as a frequency band of a predetermined frequency bandwidth about a predetermined frequency (e.g., a ±0.1 MHz bandwidth). However, the frequency channel is not limited to the above-described frequency bandwidth. Further, the frequency channels may be particular frequencies different from each other.

The present invention makes it possible to measure an electromagnetic field distribution while considering variation with time and reducing the influence of noise floor (thermal noise), makes it possible to perform an electromagnetic field distribution measurement while considering variation with time as well as factors for the magnitude of the measured signal in the case of measurement of the influence on the receiving sensitivity of a digital communication device, and thereby ensures that the relationship between mapping of the electromagnetic distribution and the receiving sensitivity can be made definite.

The invention claimed is:

1. An electromagnetic field distribution measuring apparatus for measuring an electromagnetic field distribution in the vicinity of an object to be measured, the object being arranged to function as an electromagnetic wave radiation source, the apparatus comprising:

a probe for deriving a signal corresponding to intensity of an electric field and/or a magnetic field in a space in the vicinity of the object to be measured;

a scanner for scanning the probe at an arbitrary set of measurement coordinates;

a detector arrangement for detecting the signal during a predetermined measurement time period at each of sets of measurement coordinates at which the probe is positioned, and storing the results of measurements with the probe;

a computer arrangement for (a) computing the field intensity during the measurement time period based on the detected signals; (b) computing an amplitude probability distribution during the measurement time period at each set of measurement coordinates based on the computed intensity; and (c) mapping data about the electromagnetic field distribution on the object to be measured by using intensity values of the amplitude probability distribution when a probability is a predetermined value at the measurement coordinates, or by using probability values of the amplitude probability distribution when an intensity is a predetermined value at the measurement coordinates.

2. An electromagnetic field distribution measuring apparatus for measuring an electromagnetic field distribution in the vicinity of an object to be measured, the object being arranged to function as an electromagnetic wave radiation source, the apparatus comprising:

a probe for deriving a signal corresponding to intensity of an electric field and/or a magnetic field in a space in the vicinity of the object to be measured;

a scanner for scanning the probe at an arbitrary set of measurement coordinates;

a detector arrangement for detecting the signal during a predetermined measurement time period at each of sets of measurement coordinates at which the probe is positioned, and storing the results of measurements with the probe, wherein the detector arrangement is arranged for (a) detecting the signal in each of a plurality of frequency bands during the measurement time period with respect to each of the sets of measurement coordinates at which the probe is positioned, and (b) storing the results of the measurements with the probe, and a computer arrangement for (a) computing the field intensity during the measurement time period based on the detected signals; (b) computing an amplitude probability distribution during the measurement time period at each set of measurement coordinates based on the computed intensity; and (c) mapping data about the electromagnetic field distribution on the object to be measured further including mapping according to information corresponding to the amplitude probability distribution at the measurement positions, wherein the computer arrangement is arranged for computing the distribution of the intensity corresponding to variations with time during the measurement time period in each of a plurality of frequency bands.

3. A non-transitory computer readable storage medium containing computer instructions stored therein for causing a computer arrangement to compute an electromagnetic field distribution in the vicinity of an object to be measured, the object being arranged to function as an electromagnetic wave radiation source, the field distribution being computed from the intensity of an electric field and/or a magnetic field in a space in the vicinity of the object to be measured, the computer instructions causing the computer arrangement to perform:

a detection step including detecting a signal corresponding to the field intensity at an arbitrary set of measurement coordinates in the space in the vicinity of the object to be measured during a predetermined measurement time period, and storing the signal;

an intensity computation step including computing the field intensity at the set of measurement coordinates during the measurement time period based on the detection step;

a distribution computation step including computing an amplitude probability distribution during the measurement time period based on the intensity computation step; and a step of mapping data about the electromagnetic field distribution on the object to be measured by using intensity values of the amplitude probability distribution when a probability is a predetermined value at the measurement coordinates or by using probability values of the amplitude probability distribution when an intensity is a predetermined value at the measurement coordinates.

4. The non-transitory computer readable storage medium containing computer instructions stored therein according to claim 3, wherein the detection step includes detecting the signal in each of a plurality of frequency bands during the measurement time period with respect to each of the sets of measurement coordinates at which a probe for deriving the detected signal is positioned, and storing the results of measurements made with the probe, and the distribution computation step includes computing the distribution of the field intensity corresponding to variations with time during the measurement time period in each of the plurality of frequency bands.

5. The non-transitory computer readable storage medium containing computer instructions stored therein according to claim 4, further including mapping data about the electromagnetic field distribution on the object to be measured further including mapping according to information corresponding to the arbitrary set of measurement coordinates and information corresponding to the field intensities amplitude probability distributions at sets of measurement coordinates.

6. An electromagnetic field distribution measuring method in which intensity of an electric field and/or a magnetic field in a space in the vicinity of an object being measured and that functions as an electromagnetic wave radiation source is detected with a probe that measures an electromagnetic field distribution in the vicinity of the object to be measured, the method including:

a detection step including scanning with the probe in an arbitrary measurement position in the space in the vicinity of the object being measured, and detecting the intensity sensed by the scanning with the probe during a predetermined measurement time period at a plurality of probe measurement positions;

a computation step including computing an amplitude probability distribution during the measurement time period; and mapping data about the electromagnetic field distribution on the object to be measured by using intensity values of the amplitude probability distribution when a probability is a predetermined value at the measurement coordinates, or by using probability values of the amplitude probability distribution when an intensity is a predetermined value at the measurement coordinates.

* * * * *